(12) United States Patent
Rau et al.

(10) Patent No.: US 6,222,757 B1
(45) Date of Patent: Apr. 24, 2001

(54) CONFIGURATION MEMORY ARCHITECTURE FOR FPGA

(75) Inventors: Prasad Rau, Santa Clara; Atul V. Ghia, San Jose; Suresh M. Menon, Sunnyvale, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/030,616

(22) Filed: Feb. 25, 1998

(51) Int. Cl.[7] .................................................. G11C 11/00
(52) U.S. Cl. ................ 365/154; 365/189.12; 365/189.05
(58) Field of Search ...................... 365/154, 156, 365/189.05, 189.12

(56) References Cited

U.S. PATENT DOCUMENTS 5,862,097 * 1/1999 Toda ................................ 365/189.05

* cited by examiner

Primary Examiner—A. Zarabian

(74) Attorney, Agent, or Firm—Ronald C. Fish; Edel M. Young

(57) ABSTRACT

A configuration memory architecture for an FPGA that eliminates the need for a regular array of word lines and bit lines is disclosed. The memory is comprised, in the preferred embodiment, of a plurality of memory bytes. Each memory byte has eight SRAM latches, a single flip flop and a one-of-eight decoder having a data input coupled to the inverting output of the flip flop and eight individual data outputs, each of which is coupled to a data input of one of the SRAM latches. The decoder also has address and write control inputs which are coupled to a state machine or other programmable device that controls the sequencing of the loading operation to load configuration data into the memory. The flip flops of all the memory bytes are coupled together in a serpentine shift register. Loading of configuration data involves shutting all paths through the decoder down, shifting all configuration bits for the "0" position SRAM latch of each memory byte into the shift register, and setting the address bits to the decoder so as to create a conductive path in each memory byte from the output of the flip flop to the data input of the selected SRAM latch. The process is then repeated for all other SRAM latches.

1 Claim, 17 Drawing Sheets

STATE MACHINE

FLIP - FLOP

BIT STREAM FORMAT

ADDRESS FRAME FORMAT

SYNCPASS CIRCUIT

DATA LOAD CIRCUIT

μP HANDSHAKE

CONFIGURATION MEMORY ARCHITECTURE FOR FPGA

FIELD OF USE

This invention relates to the field of field programmable gate arrays that have static RAM which stores programming bits which define the functionality of the field programmable gate array.

In prior art FPGAs which are SRAM based, there are thousands of individual memory bits which define the desired functionality of the device. These bits are loaded one at a time using the word lines and bit lines and addressing circuitry to address each bit. The bit and word lines define an array with the word lines typically running across the entire FPGA in one direction and the bit lines running across the entire FPGA in an orthogonal direction. The individual memory cells in the array are coupled to the word lines and bit lines in the interstices of the matrix defined by the lines. The whole memory array has to be relatively regular. The memory cells contain the control bits to turn switches on and off in the FPGA's logic blocks to define the configuration and functionality of the logic blocks. Generally, the memory cells need to be close to the logic blocks they control to minimize routing problems. This forces the logic blocks to be fabricated inside the interstices of the array defined by the word and bit lines of the SRAM memory array. This puts a constraint on the layout of the FPGA which can adversely affect the circuit design because of insufficient space and non optimal spacing between different logic blocks that need to communicate data therebetween.

By forcing the logic blocks to be in the interstices of the memory array in prior art FPGAs, it is frequently necessary to run high speed signal lines over the top of memory cells. Although these high speed signal lines are insulated from the memory cell, they still radiate electromagnetic noise. The EMC emissions can cause soft errors by changing the state of data in the memory cells through capacitive coupling of energy from the high speed data signal into the memory cell. While it is not possible to completely eliminate this problem, it can be alleviated through use of the invention.

The purpose of an FPGA is to provide a customizable logic array to the customer. The critical path is in the design of the FPGA and not the design of the SRAM memory which defines the function of the FPGA. Therefore, the restriction in space available and the routing complications that are caused by the need in the prior art to place logic blocks in the interstices of the logic array create problems.

Thus, a need has arisen for an FPGA structure wherein the need for regularity in the array structure is eliminated such that there is no need to place the logic blocks in the interstices of the memory array.

SUMMARY OF THE INVENTION

The invention eliminates the need for a regular array of word lines and bit lines running across the FPGA and the need to put the logic blocks into the interstices of the bit line/word line matrix. An FPGA using the configuration memory according to the teachings of the invention will have the memory cells placed close to the switches etc. being controlled. This allows the memory cells to be built small since they do not need a large drive capability, and it also eliminates long routes for control signals from the memory cells to the devices being controlled thereby. This allows a logic designer specifying the function of an FPGA using the teachings of the invention to optimize the critical paths by placement and routing decisions that make the most sense. The memory cells can be placed anywhere in the logic block, but they are usually placed close to the device being controlled. The selection or control lines can be run to the portions of the various logic blocks being controlled. The memory architecture according to the teachings of the invention also reduces the number of high speed data paths that must be routed over memory cells thereby creating the possibility of soft errors.

These advantages are achieved through the use of a memory architecture that eliminates the use of a conventional regular array of bit lines and word lines to load configuration data into the memory cells. The memory configuration will be called a memory byte architecture because each decoder and group of memory cells includes eight memory cells for storing eight configuration bits. There is nothing critical about the number eight, and other sizes of groupings can also be used.

In the preferred embodiment, each memory byte has a single flip flop or bistable latch for storing one configuration bit to be loaded into one of the eight static RAM latches. A one-of-eight decoder is interposed between the single flip flop and the eight static RAM latches. The purpose of this decoder is to steer the configuration bit in the flip flop to a selectable one of the eight static RAM latches under the influence of addressing signals supplied by a state machine or programmable computer. The state machine or programmable computer controls a sequence of events to load bits into all eight of the eight static RAM latches of each memory byte. The reader should understand that the selection of the number eight for the number of SRAM latches or other types of memory cells in each memory byte of the configuration memory was purely an arbitrary choice and other numbers could also be chosen with a suitable increase in the span of the decoder from one-of-eight to one-of-X where X is the number of memory cells in each memory "byte". Hereafter, the word "byte" should be understood as referring to the number X whatever that number is chosen to be.

The overall memory structure of a FPGA using the teachings of the invention uses a plurality of these memory bytes. It is the eight static RAM latches of each memory byte which store configuration data which generates the logic signals which are coupled to various switches in the logic blocks and define the functionality of the FPGA.

The configuration data stored in the eight static RAM latches of each memory byte is stored in the static RAM latches using a special memory loading technique involving a serpentine shift register. The single flip flop of each memory byte structure is one link in the serpentine chain of flip flops, all flip flops being connected to act as a serial-input, parallel-output shift register. One output of each flip flop is coupled to the data input of the next flip flop in the serpentine chain. The other output of each flip flop is coupled to the data input of the one-of-eight decoder. The address inputs of the decoder are coupled to the state machine. Each decoder of each memory byte is coupled to the same address bits. Each of the one-of-eight decoders has eight individual data outputs which are coupled to the data inputs of the eight static RAM latches.

Loading of configuration data into the eight static RAM latches of each memory byte structure is accomplished as follows. First, the state machine sets the address bits to all zeroes so as to cut off conductivity of all data paths through the decoder. Then the state machine loads the configuration data that is to be stored in all the "0" position static RAM latches of all the memory byte structures having their flip flops in the serpentine chain shift register. This data is in serial format and is shifted into the serpentine chain by clocking the flip flops in the chain as many times as there are flip flops in the chain and bits to be stored. After all the bits are loaded, the state machine changes the address bits to cause each decoder to create a conductive path between the data input of the decoder and the data input of the static RAM latch in the "0" position. This causes the configuration bit in each flip flop to be loaded into the "0" position static RAM latch of each memory byte. Next, the state machine sets the address lines to all zeroes again to close all conductive paths through the decoder, and the configuration bits for the "1" position static RAM latches of each memory byte is shifted into the serpentine shift register. After that data is loaded, the state machine changes the address bits to all the decoders to cause them to open a conductive path from the decoder data input to the data input of the "1" position static RAM latches of all memory bytes. This causes all the "1" position static RAM latches to be loaded. This process is repeated until all the static RAM latches have been loaded.

DETAILED DESCRIPTION OF THE PREFERRED AND ALTERNATIVE EMBODIMENTS

Figure 1:
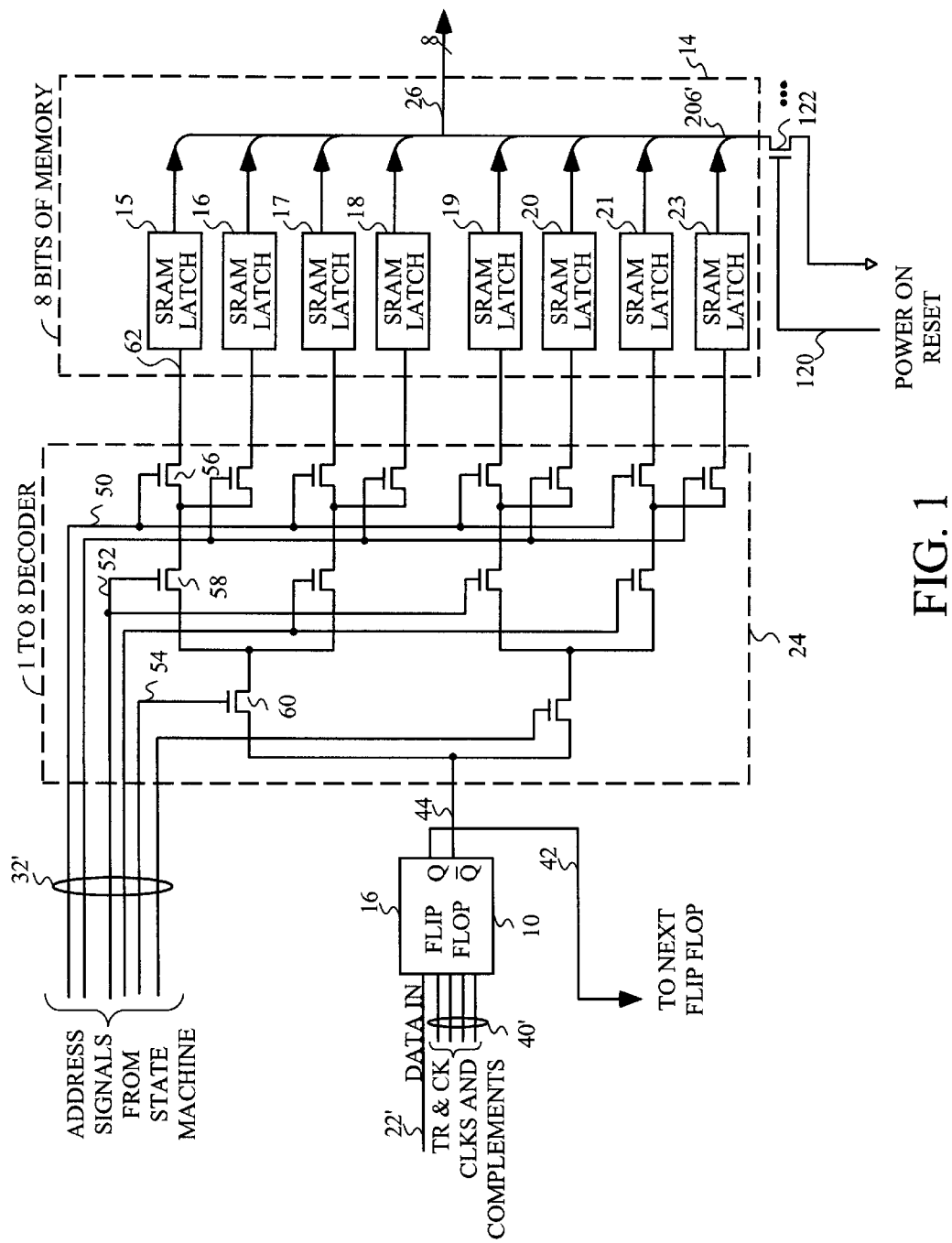
FIG. 1 is a diagram of the circuitry used in the invention to implement 8 bits of SRAM control memory for an FPGA using a serpentine shift register and a one-of-eight decoder for each group of eight SRAM latches.

Referring to FIG. 1, there is shown the circuitry used in the invention to implement 8 bits of SRAM based control information for a field programmable gate array. The memory system is comprised of a flip flop 10, a one-of-eight decoder 24 and 8 bits of SRAM memory 14, each bit being a regenerative SRAM latch. The eight individual latches are shown at 15 through 23. The particular type of SRAM memory cell used is not critical to the invention. Each SRAM latch has a data output line which forms an individual conductor of bus 26 and is output to a particular switch, driver, multiplexer or active link somewhere in the FPGA or the neighboring horizontal and/or vertical buses. The details of an FPGA structure in which the invention is particularly useful are given in a U.S. patent application Ser. No. 08/978,451, filed Nov. 25, 1997, the details of which are hereby incorporated by reference.

Each SRAM latch has a data input such as data input 62 which is coupled to one of eight individual output lines from the decoder 24. Each data input line 62 can be individually coupled through the decoder 24 to the Q* output line 44 of the flip flop 16.

Prior art FPGAs used a uniform array of SRAM bits spread out all across the FPGA die. This tended to result in a memory array of a generally fixed size regardless of the actual number of bits required to program the logic blocks of a particular FPGA. The number of bits needed to program any particular FPGA depends upon the desired functionality for that FPGA which depends upon the individual customer needs. The uniform array of memory bits spread out across the die of the FPGA is a "one size fits all" arrangement that will be too big for some applications and use too many bits consuming too much chip area. Using the memory system of the invention, only the number of bytes of SRAM memory as are needed may be added to whatever spare space there is on the FPGA die. Then the select lines can be run to the logic blocks from each of the memory latches.

Figure 2:
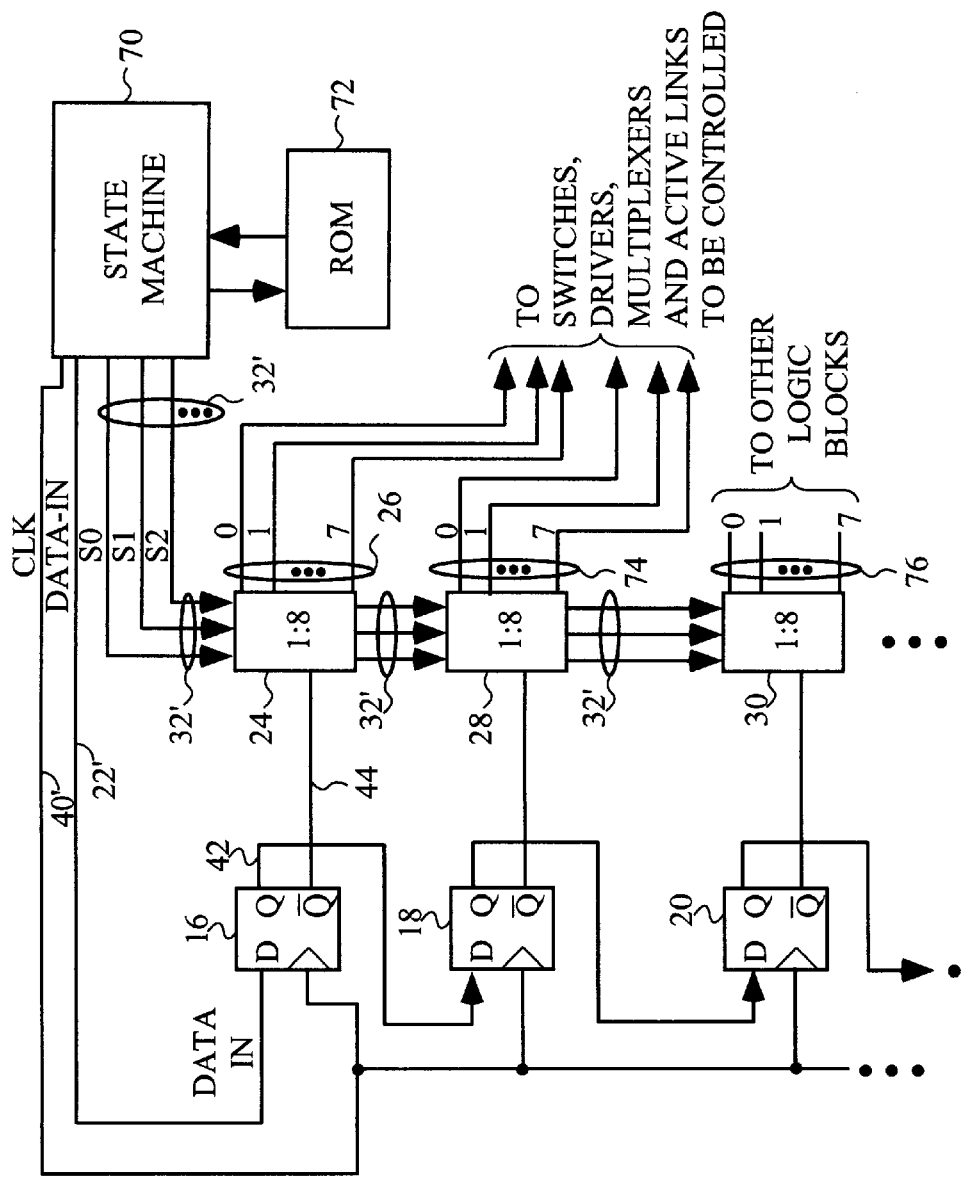
FIG. 2 is a block diagram showing the connections between a state machine, a nonvolatile memory, a serpentine shift register and a plurality of memory bytes, each comprised of eight SRAM latches and a one-of-eight decoder for an embodiment wherein the configuration memory cells of individual logic blocks are not individually addressable for each logic block.

To understand the memory structure of an FPGA utilizing the invention to get away from the disadvantages of a regular array of SRAM cells spread throughout the FPGA die, consider FIG. 2. FIG. 2 is a diagram showing how a serpentine shift register is used to load the data bits into the SRAM cells in an FPGA utilizing the teachings of the invention for an embodiment wherein the configuration memory cells of individual logic blocks are not individually addressable for each logic block. In the preferred embodiment, the configuration memory cells in each logic block are individually addressable and each logic block has its own serpentine shift register. A serpentine shift register is formed of a plurality of flip flops, of which, flip flops 16, 18 and 20 are typical. The first flip flop in the chain has its Data In line 22' coupled to a serial bus which carries all the programming bits to be loaded into the various SRAM latches in a serial stream, except that the serpentine shift register, at any particular time, stores only the bits to be loaded into all the "0" bit locations or all the "1" bit locations etc. In other words, referring to FIG. 1, if SRAM latch 15 were assigned as the "0" bit, then SRAM latch 23 would be the "7" bit and SRAM latch 16 would be the "1" bit. The Q output 42 of the first flip flop 16 in the serpentine shift register is coupled to the data input of the next flip flop in the chain. The Q output of the next flip flop is coupled to the data input of the next flip flop in the chain, and so on for the entire length of the serpentine shift register. The Q* output of each flip flop is the data input to the decoders served by that flip flop.

In FIG. 2, the one-of-eight decoder 24 and the eight SRAM latches 15, 16, 17, 18, 19, 20, 21 and 23 are all combined into one block 24 with the eight individual output lines labelled 0 through 7 and designated as bus 26. Each group of eight SRAM latches will be referred to as a memory byte. FIG. 2 shows only three such memory bytes at 24, 28 and 30 although there are 38 such memory bytes in each logic block in the FPGA in the preferred embodiment. The memory bytes 24, 28 and 30 also represent memory bytes having nonvolatile memory cells such as EEPROM along with suitable programming and read circuitry, as described in more detail below. One logic block in a typical FPGA manufactured by the assignee of the invention requires 304 SRAM latches to completely program it so a serpentine shift register which is at least long enough to couple to enough group of eight memory elements to make up 304 bits is required. The serpentine shift register for one of these logic blocks only needs to have 38 bits.

The serpentine shift register stores only data for all the "0" bits or all the "1" bits at any particular time. Therefore, it is the job of the decoders such as decoder 24 to steer the data from the flip flop in the serpentine shift register to the appropriate one of the SRAM latches during the loading process. In FIG. 2, there are addressing signals on bus 32' which serve to control all the decoders to steer the data in the flip flops of the serpentine register to the appropriate corresponding SRAM latch.

Figure 3:
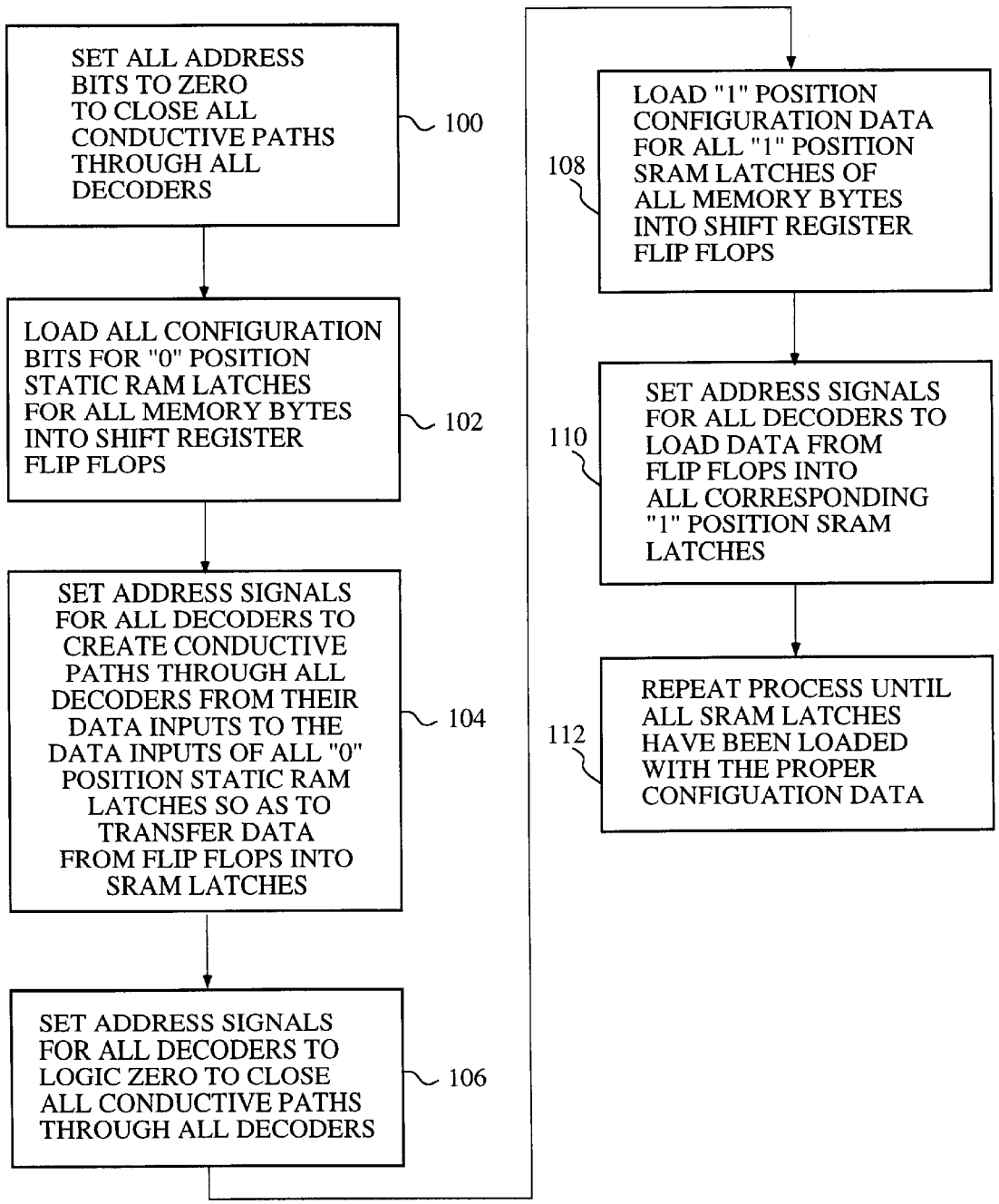
FIG. 3 is a flow chart of the process carried out in the memory structure of the FPGA to load the configuration bits in each of the eight static RAM latches of each memory byte.

The function of the decoder 24 is to steer the input data into the proper one of the latches 15 through 23. Only one latch is loaded at any particular time in any particular group of eight bits. Therefore, to load all eight SRAM latches entails the following processing, as shown in the flowchart of FIG. 3. First, as represented by block 100, all address bits are set to logic zero so as to close all conductive paths through the decoder. Setting the address bits to logic 0 closes all conductive paths from the data input of the decoder to the data outputs because all the address lines are coupled to the gates of NMOS devices which are turned off by the logic zero level. These NMOS devices are in all the conductive paths in the decoder between the data input and data outputs, so when the address lines are all logic 0, all these paths are rendered non-conductive.

Next, as represented by block 102 in FIG. 3, all bits for all "0" position latches are put on Data In bus 22' in serial format in the proper sequence and shifted into the serpentine shift register by applying clocking signals to the CLK bus 40'. The clock bus 40' has 2 clock lines comprising the CK and TR clocks and the local clock bus of each logic block also carries the inverse of each of the CK and TR clock signals. Although it appears that two clocks are used, only one clock is actually used to load the shift register. A number of clock cycles equal to the number of bits to be loaded are applied to the clock bus 40'. On each clock cycle, another bit is shifted into the first flip flop in the shift register. On each subsequent clock cycle, a new bit is shifted in and all the bits already in the shift register move down by one bit.

Next, the "0" position configuration data must be loaded into the "0" position static RAM latches. This process is represented by block 104 wherein the appropriate addressing signals are applied to the address bit conductors of bus 32' in FIG. 2 to set up a conductive path from the data input of the decoder to the data input of the "0" position static RAM latch. The number of address bits used depends upon the number of SRAM memory cells being served by the decoder. For eight memory cells, 6 address bits will suffice to control the various levels of the decoder. More precisely, these addressing signals cause the one-of-eight decoder 24 to activate, i.e., render conductive, the particular one of its eight paths from the Q* (Q bar or 0 not) output of flip flop 16 to the data input of the "0" position SRAM latch within memory byte 24. The state machine generates the address signals on bus 32 and keeps them activated for 5 clock cycles in the preferred embodiment. During these five clock cycles, the CK and TR clock signals are maintained high while a clock signal in the state machine beats out 5 cycles. In other embodiments where other technologies such as EEPROM cells are used and the write cycle takes longer, the address bits are held constant at the address that causes the proper conductive path to be formed for a longer time which is sufficient to complete the write programming.

As an example of how the decoder sets up this conductive path, in the embodiment of FIG. 1, to render the path from Q* output 44 of flip flop 16 conductive to the data input of the "0" position latch 15, the address lines 50, 52 and 54 are set to logic 1. These events turn on NMOS devices 56, 58 and 60, respectively, and this couples line 44 to data input line 62 of latch 15.

The addressing signals on bus 32' in FIG. 2 are coupled to each one of the decoders in the chain of memory bytes including memory bytes 24, 28 and 30 as well as any other decoder in the chain. Thus, each decoder activates its path from the Q* output of the corresponding flip flop in the serpentine shift register chain to the data input of its "0" position SRAM latch. The activation of these paths means the paths become conductive thereby causing the data bit residing at the Q* output of each flip flop in the serpentine shift register chain to be copied to the appropriate SRAM latch in the memory byte.

After all the "0" position latches are loaded, the address bits on bus 32' are again all set to logic 0 to close all conductive paths to the latches, as symbolized by block 106 of FIG. 3. Then, as symbolized by block 108, the data for the "1" position latches is shifted into the serpentine shift register by the same process described above fore block 102. In block 110, the addressing signals on bus 32' are changed so as to activate the path from the Q* outputs of the flip flops in the serpentine shift register to the data inputs of the "1" position latches to copy the configuration bits just loaded into the serpentine shift register into all the "1" position SRAM latches. This process is then repeated for all the other SRAM latch positions until all SRAM latches have been loaded, as symbolized by block 112.

The bit streams of data on line 22' loaded into the serpentine shift register and the address signals on bus 32' are supplied by a state machine based upon data stored in a nonvolatile ROM 72 and/or supplied by a user at an external pin. The data in the ROM (typically located off-chip) defines the functionality of the FPGA as encoded in the bits on buses 26, 74, 76 etc. from all the data bytes. The state machine functions to read the ROM 72 at start up and cycle through the loading process defined above to load all SRAM latches of all memory bytes. That is, unless the ROM has been changed, the FPGA forgets what it was each time it is powered down, but is re-established with the same functionality at each power up time so long as the ROM has not been changed in the interim.

The design for the particular state machine used is not critical to the invention, and any state machine or programmable device which can carry out the process described above in putting serial data on bus 22 and managing the address lines as described to accomplish loading each of the SRAM latches will suffice to practice the invention. The ROM 72 stores the data that must be loaded into the individual SRAM latches and may store a program to control a programmable device if a programmable device such as a microprocessor or microcontroller is substituted for the state machine 70. Any programmable microcontroller, microprocessor, computer or state machine that can carry out the process of FIG. 3 or the processes described for the alternative embodiments discussed below will suffice for purposes of practicing the invention.

Figure 4:
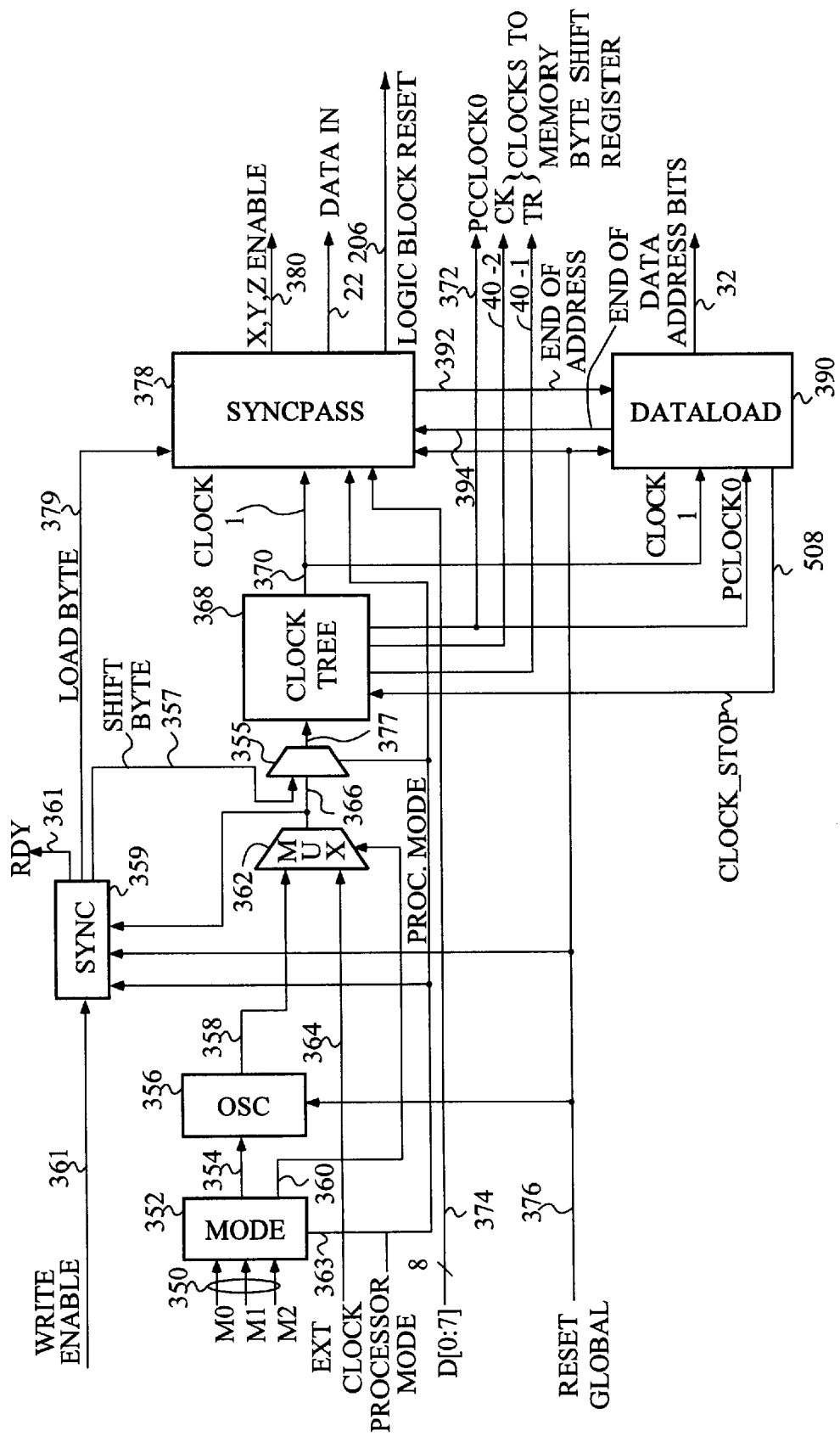
FIG. 4 is a block diagram of a state machine suitable for sequencing and controlling the configuration bit loading process.

The particular state machine that is preferred is illustrated in block diagram form in FIG. 4. Mode select signals on bus 350 select one of the following modes of operation: serial internal mode wherein the configuration data is supplied to the FPGA at an external pin in serial format and a master clocking signal to drive the FPGA state machine are generated internally; serial external mode wherein both the data and master clock signal are supplied at an external pin (the data in both the serial internal and external modes is usually read from an external ROM which is addressed by a clock signal supplied to it by the state machine on the FPGA, the ROM simply presenting a new bit at the D0 data input pin of the FPGA on every new clock cycle); microprocessor mode wherein and external microprocessor reads the configuration data from its memory and presents the data to the FPGA in byte-wide chunks on external pins D0–D7, one byte being transmitted after activation of each READY signal; a readback mode during which configuration bits from a selected logic block are read back out of the SRAM latches or memory cells through the decoder into the shift register and then shifted serially out for debug purposes; and a reserved mode which currently does nothing.

Figure 9:
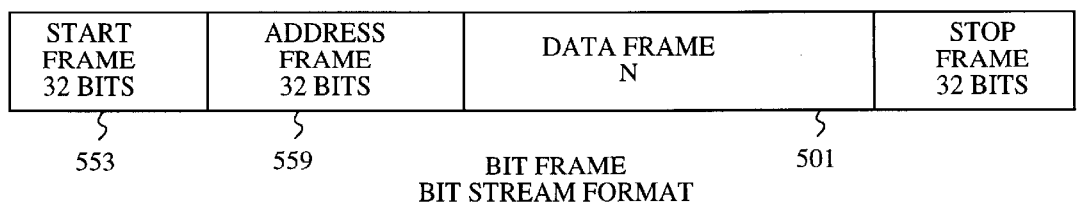
FIG. 9 is the format of the bit frame used to program one or more selected logic blocks.
Figure 10:
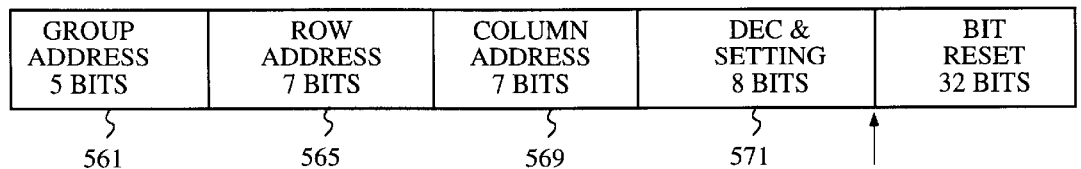
FIG. 10 is the format of the address field or frame within the bit frame.

The state machine operation depends upon a predetermined format for the serial bit stream in the preferred embodiment, but other state machine designs with different data format bit streams or even parallel format input frames will work to practice the invention. The preferred format for the bit stream is shown in FIG. 9, and the preferred format for the address frame format is shown in FIG. 10. The bit stream format for the serial input data stream used in all the modes is comprised of a start frame of 32 bits, and address frame of 32 bits, a data frame having N bits where $$N=(R+M)*8$$

where R equals the number of flip flops in the serpentine shift register to be loaded; and M equals the number of write cycles to copy the data from the shift register into the memory cells.

Finally, a stop frame of 32 bits completes the bit stream. The start and stop frames can be any unique code which is recognizable by the state machine to serve as frame delimiters. The particular code selected is not critical to the invention and any code which is not likely to be found in the configuration data itself will work as well as any other.

The address frame of 32 bits is comprised of: 5 bits which define the group; 7 bits which define the row address of the logic block to be loaded or reloaded; 7 bits which define the column address of the logic block to be loaded or reloaded; 8 bits which act as a delay to allow decoding levels to settle so that the X, Y and Z enable signals for the logic block selected by the row and column addresses stabilize to turn on a block enable circuit (X, Y and Z signals and Block Enable circuits shown in FIGS. 6 and 7) so that only the selected logic block has its configuration memory loaded or reloaded and no other; and 5 bits which are used to activate a selected Logic Block Bit Reset signal for the selected logic block for 5 cycles. The 5 bit group address establishes the state of the Z enable signal, since the logic blocks on the preferred FPGA are divided into four quadrants and their are multiple I/O structures, one on each side of the FPGA chip, which need to be controlled as well as two different PLLs on board the chip. All these circuits combine to make up the different groups.

In FIG. 4, mode decoder 352 decodes the mode select signals on bus 350 and generates signals on lines 354 and 360. The signal on line 354 starts the oscillator 356 to generate a master clock signal on line 358 if the serial internal mode or microprocessor mode is selected. The signal on line 360 controls selection by a multiplexer 362 between the master clock signal on line 358 for serial internal mode and an externally supplied clock signal on line 364 for serial external mode and readback mode. The mode decoder circuit 352 also generates a switch control signal on line 363 which control the selection state of a multiplexer 355 so as to select a SHIFT BYTE clock signal on line 357 during microprocessor mode, or to select the clock signal on line 366 during either serial internal or serial external modes. The output of multiplexer 355 is coupled via line 377 to the input of the clock tree. The SHIFT BYTE clock signal is an 8 pulse clock signal having the same frequency as whatever clock signal is selected for line 366. The SHIFT BYTE clock signal is generated by SYNC logic 359 whenever a WRITE ENABLE signal on line 361 is activated by an external processor in microprocessor mode.

The mode decoder 352 also generates a PROCESSOR MODE signal on line 363 which is active during microprocessor mode and is coupled to the SYNCPASS circuit 378. The function of this signal will be explained below when the details of SYNCPASS are given. The SYNC circuit 359 receives the PROCESSOR MODE signal on line 363 and the clock signal on line 366 as well as the RES ET signal on line 376 as inputs. When microprocessor mode is selected, the SYNC circuit activates the RDY signal on line 361 to tell the external microprocessor that the state machine is ready to receive a byte of data from the frame of data detailed in FIG. 9. The microprocessor then activates the WRITE ENABLE signal on line 361 for three clock cycles and places the 8 bit byte on data bus 374. The SYNC circuit then activates a LOAD BYTE signal on line 379 coupled to the SYNCPASS circuit. This LOAD BYTE signal causes an 8 bit shift register (381 in FIG. 12) in the SYNCPASS circuit to parallel load the byte on the data bus. The SYNC circuit 359 then generates the 8 cycles of the SHIFT BYTE clock signal using the clock signal on line 366. The multiplexer circuit 355 has the SHIFT BYTE signal on line 357 selected during processor mode so the SHIFT BYTE signal is supplied on line 377 to the clock tree circuit which supplies it on line 370 to SYNCPASS as the CLOCK 1 signal on line 370. The CLOCK 1 signal causes the 8 bit shift register to serially shift out the byte just received in serial format such that the SYNCPASS circuit thereafter can process the data like it was in serial internal or serial external mode.

Figure 11A:
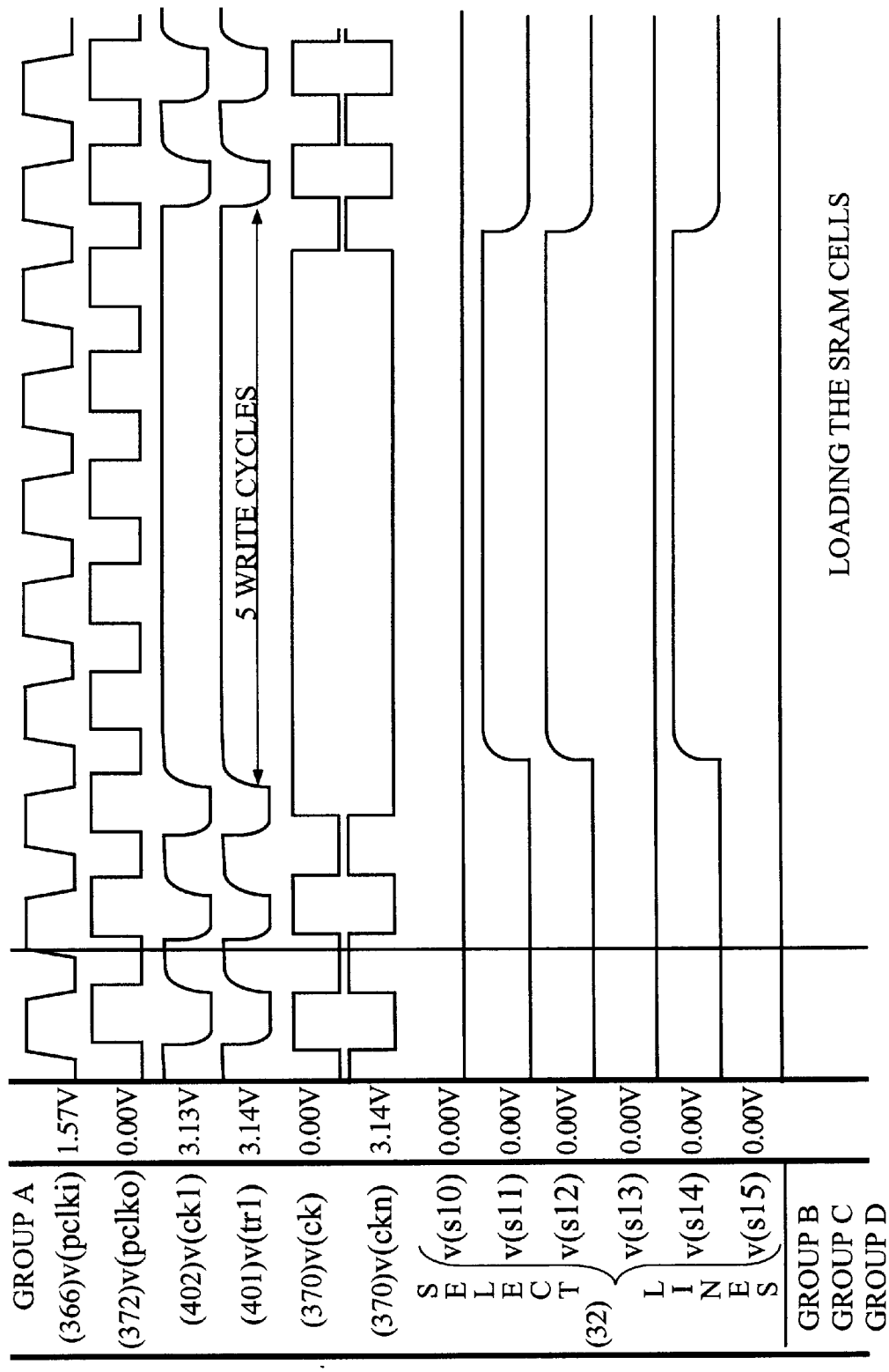
FIGS. 11A, 11B and 11C are timing diagrams for the various clock signals generated by the clock tree in the state machine during the serial data loading modes, the microprocessor mode and the readback mode, respectively.
Figure 11B:
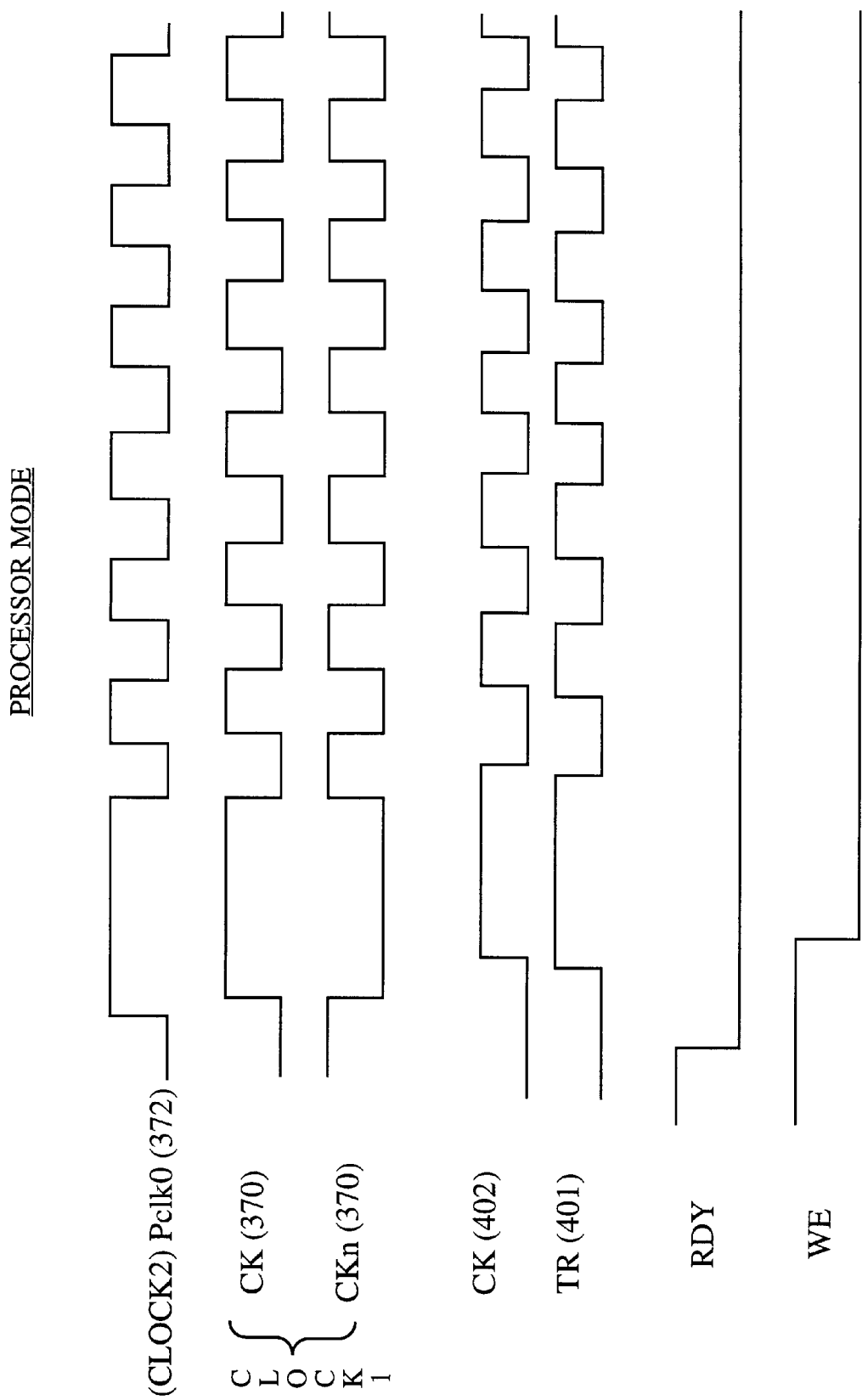
Figure 11C:
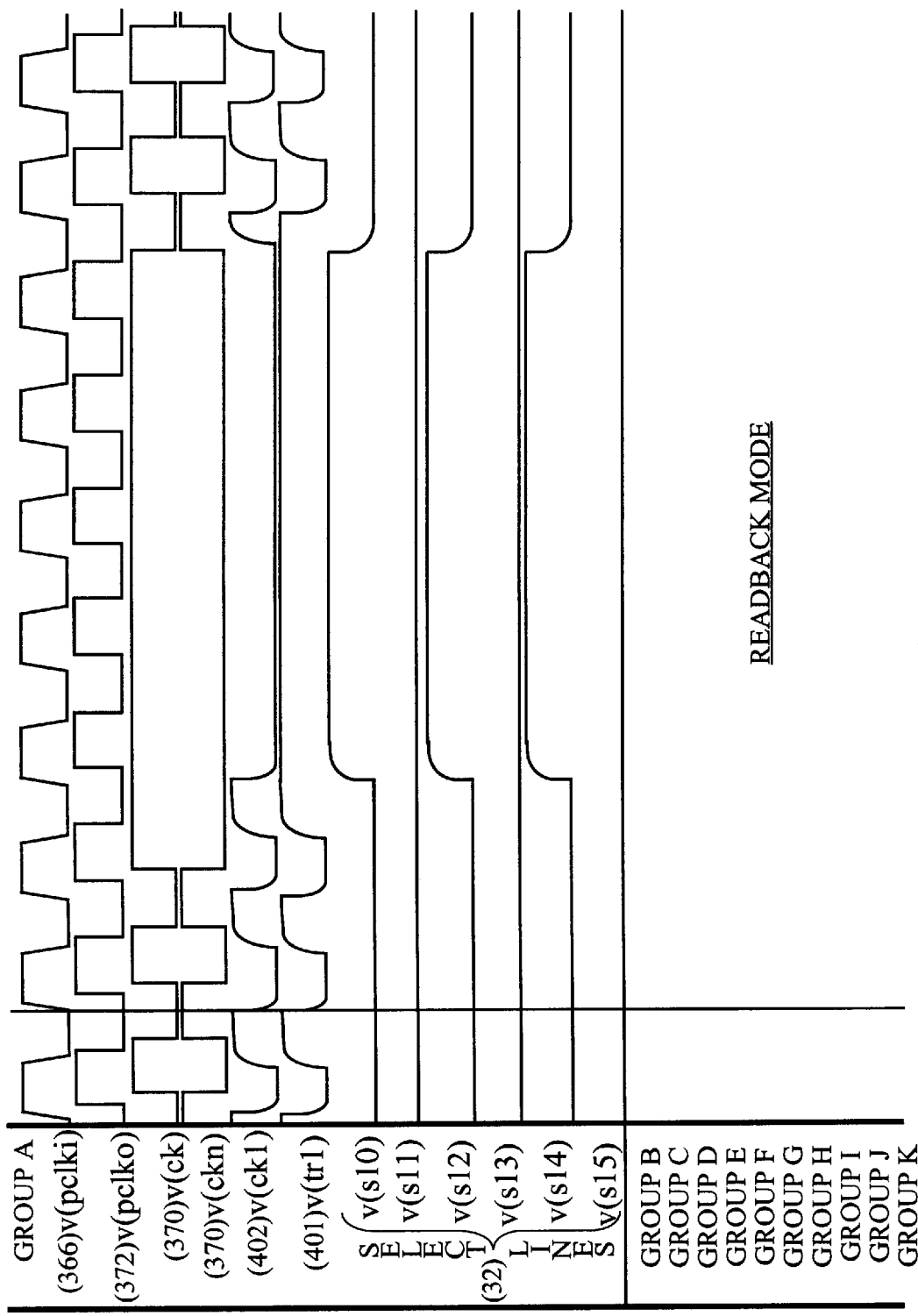

Whichever clock signal is selected during serial external or serial internal mode by multiplexer 362 is supplied on line 366 to multiplexer 355, and if either serial internal or serial external modes are in effect, the clock on line 366 is coupled to the clock tree circuit 368. The function of the clock tree circuit is to generate clock signals on lines 370, 372, 40-1 (the TR clock) and 40-2 (the CK clock). These clock signals have the relationship shown in the timing diagram of FIGS. 11A, 11B and 11C, and any clock generation circuit that can generate clock signals having the relationships shown in these figures will suffice to practice the invention. FIGS. 11A, 11B and 11C are timing diagrams for the various clock signals generated by the clock tree in the state machine during the serial data loading modes, the microprocessor mode and the readback mode, respectively. The clock signals on these figures are identified by the line numbers on FIG. 4 on which each clock signal appears. The line numbers are the numbers in parenthesis to the left of each time line. Generally, the CK and TR clocks are identical in frequency and phase and in all other respects during the loading cycle and are substantially identical during readback mode except for a slight difference during an initial interval when they are complementary and CK is low slightly longer than TR is high.

The data bits of the bit stream that supply address and configuration data in the format shown in FIG. 9 are supplied on the byte wide data bus 374. During the serial internal and serial external modes, the data is supplied in serial format on the D0 line of the data bus.

A RES ET signal on line 376 is supplied from an external source to start off the process of loading or reloading configuration bits into the memory bytes of a selected logic block. The DATALOAD and SYNCPASS circuits receive the RES ET signal on line 376 as inputs.

The Data bus 374 and the clock signal on line 370 are coupled to a SYNCPASS circuit 378 which uses them to generate the X, Y and Z enable signals on a bus 380 and the global Data In signal which is coupled to the data input of every block enable circuit which, when enabled for a particular logic block, couples it to the Data In local bus 22' which is coupled to the data input of the first flip flop in the serpentine shift register. Bus 380 contains three signal lines, X, Y and Z enable, for each logic block. The SYNCPASS circuit also generates an END OF ADDRESS signal on line 392 which is coupled to a DATALOAD circuit 390.

The clock signals on lines 370 and 372 and the END OF ADDRESS signal plus the RES ET signal on line 376 are inputs to the DATALOAD circuit 390. This circuit functions to generate the global address bits on bus 32 that control which paths through the decoders in the memory bytes are conductive at any particular time. The DATALOAD circuit also generates and END OF DATA signal on line 394 which is coupled to the SYNCPASS circuit. The DATALOAD circuit also generates a CLOCK_STOP signal on line 508 after the serpentine shift register of the selected logic block has been completely loaded. This signal serves to stop the CLOCK 1 signal while leaving the PCLOCK0 signal running so that the DATALOAD circuit can count out the 5 clock cycles of the write interval.

Figure 12:
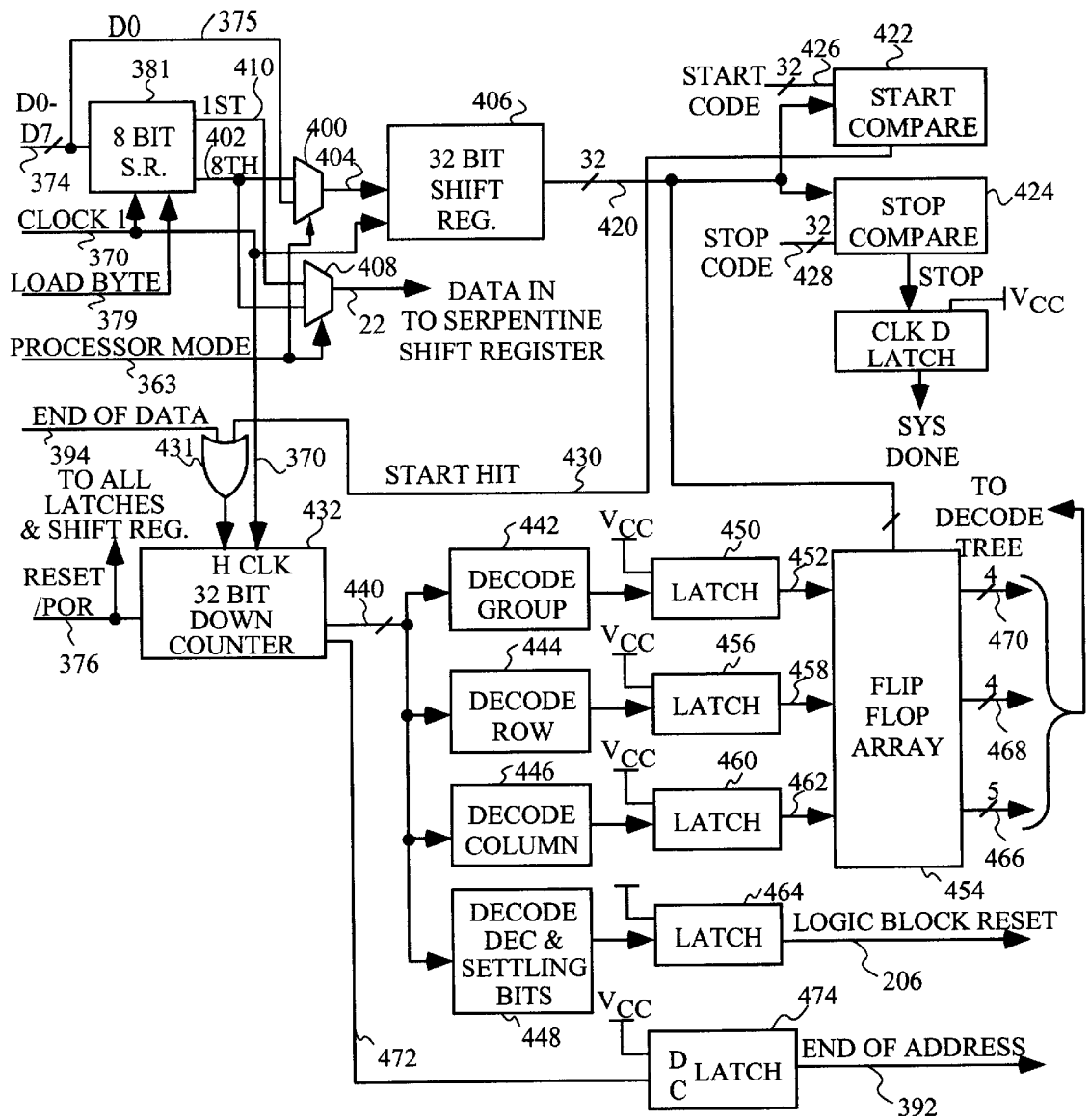
FIG. 12 is a block diagram of the SYNCPASS circuit in the state machine.

Referring to FIG. 12, there is shown a block diagram of the SYNCPASS circuit. This circuit includes an 8 bit shift register 381 coupled to data bus 374 and having as additional inputs the CLOCK 1 signal on bus 370 and the LOAD BYTE signal on bus 379 and the RES ET signal on line 376. The shift register 381 is bypassed by the D0 bit of the data bus on line 375 which is coupled to one input of multiplexer 400. The other input of this multiplexer 400 is the data output of the 8th flip flop in shift register 381 on line 402. Multiplexer 400 selects one of these two sources of data depending upon whether one of the serial modes or the processor mode is in effect, as signalled by the PROCESSOR MODE signal on line 363 coupled to the multiplexer switch control input. This signal is generated by the mode decoder circuit 352 in FIG. 4. If either the serial internal or serial external mode is in effect, line 375 is coupled through multiplexer 400 to the data input 404 of a 32 bit shift register 406 and the serial data arriving on the D0 line 375 is shifted into 32 bit shift register 406 synchronously with the CLOCK 1 signal.

If processor mode is in effect, the data arrives in 8-bit-wide chunks on bus 374 and is loaded into shift register 381 in parallel when the LOAD BYTE signal is activated. Then, the data is shifted out of shift register 381 serially onto line 402 synchronously with the CLOCK 1 signal. From there it is coupled through multiplexer 400 into shift register 406 and processed as further described below. The data on line 402 is also coupled to one input of a multiplexer 408 which serves the select the source of data to be supplied to the serpentine shift register in the selected logic block via bus 22. The selection of inputs made by this multiplexer 408 is under control of the PROCESSOR MODE signal. In microprocessor mode, line 402 is selected as that represents the serial format output data from the 8th flip flop in shift register 381 as it is shifted out after the parallel load. In either of the serial modes, the other input, line 410, is selected for coupling to bus 22. Line 410 is the data output of the first flip flop in the shift register 381.

The purpose of the 32 bit shift register is to store the start field, the address field and the stop field in that order. This is done so the start of the frame can be detected, and the address field can be captured and decoded and so that the end of the bit frame can be detected. To detect the start of the frame, the incoming data on line 404 is shifted in and the state of all 32 flip flops is simultaneously output on 32 bit bus 420. Bus 420 is coupled to one input of a start comparator 422 and is also coupled to one input of a stop comparator 424. The other input of the start comparator is coupled to the start code which is hardwired on bus 426. The other input of the stop comparator 424 is coupled to a bus 428 which is hardwired with the stop code. When all 32 bits of the bit frame start code have been shifted into the shift register 406, the start comparator 422 detects a match and activates the START HIT signal on line 430. This line is coupled to the hold input of a 32 bit count down counter 432 through an OR gate 431. The other input of OR gate 431 is coupled to receive the END OF DATA signal on line 394 from the DATALOAD circuit. This signal is activated at the end of every data frame or field in a bit frame, and is used to start the 32 bit down counter 432 counting down so as to count the 32 bits of any address field for another logic block in case more than one logic block is being programmed within a single bitstream (one bitstream or frame can contain configuration data and address fields for more than one logic block). This new address field will follow the preceding data frame, so activation of the END OF DATA signal at the end of the data frame starts the address generation process again.

The clock input of the 32 bit down counter is coupled to the CLOCK 1 signal on line 370. Another input of this counter is the RES ET signal which, when activated, initializes the counter to a preload count of 31.

When START HIT is activated at the end of the start field of the bit frame, counter 432 starts counting down from 31 to 0, one count per clock cycle. Because the address field comes in immediately following the start field if only one logic block is being programmed, or immediately at the end of the preceding data field if more than one logic block is being programmed, one bit per clock cycle, the function of the counter 432 is to count the bits of the address field as they come in.

Referring jointly to FIG. 10 for the address field format and FIG. 12, the operation of decoding the address field to generate the proper X, Y and Z enable signals to select the logic block to be configured will be discussed. The outputs of every stage of the counter are presented via bus 440 to a group decoder 442, a row decoder 444, a column decoder 446 and a DEC and Settling field decoder 448. When counter 432 has counted the first 5 bits of the address field as having arrived, shift register will now be storing the group address field and those address bits will be on bus 420. Group decoder 442 will decode the fact that the first five counts have occurred and clock latch 450 whose data input is coupled to Vcc. Latch 450 will store a logic 1 and activate a LATCH GROUP ADDRESS signal on output line 452. This line is coupled to the clock inputs of 5 flip flops inside a flip flop array 454 whose job it is to store the 5 bits of the group address subfield of the address field. These 5 flip flops have their data inputs coupled to the appropriate lines of bus 420 which will have the group address bits thereon at this point in time. When the signal on line 452 is activated, the 5 flip flops assigned to store the group address, latch whatever group address bits are on bus 420. These 5 bits are output on bus 466 where there are supplied to a group address decoder located elsewhere on the chip. The group address decoder decodes the group address bit and activates the proper Z enable line for the proper logic block to be programmed or reprogrammed.

When the counter 432 has counted down enough bits (12 bits) for the row address field to have been shifted into the 32 bit shift register 406, row decoder 444 detects this fact and activates the clock line of latch 456. This causes the latch to latch a logic 1 therein and activate a LATCH ROW ADDRESS signal on line 458. This line is coupled to the clock input of 7 flip flops in flip flop array 454 dedicated to storing the row address (only 4 are used). These flip flops have their data inputs coupled to the lines on bus 420 which will have the row address bits thereon after the row address has been shifted in. Activation of the LATCH ROW ADDRESS signal on line 458 will cause the 7 flip flops in array 454 to latch 7 bits of the row address (the other 3 MSB bits are reserved for future expansion). These 4 out of 7 bits are output on bus 468 to a row decoder located elsewhere in the FPGA. This row decoder decodes the four row bits and activates the correct X enable line for the logic block to be programmed or reprogrammed.

When the counter 432 has counted down enough bits (19 bits) for the column address field to have been shifted into the 32 bit shift register 406, column decoder 446 detects this fact and activates the clock line of latch 460. This causes the latch to latch a logic 1 therein and activate a LATCH COLUMN ADDRESS signal on line 462. This line is coupled to the clock input of 7 flip flops in flip flop array 454 dedicated to storing the column address. These flip flops have their data inputs coupled to the lines on bus 420 which will have the column address bits thereon after the row address has been shifted in. Activation of the LATCH COLUMN ADDRESS signal on line 462 will cause the 7 flip flops in array 454 to latch 7 bits of the column address (3 bits are reserved for future expansion). These 4 of 7 bits are output on bus 470 to a column decoder located elsewhere in the FPGA. This column decoder decodes the four column address bits and activates the correct Y enable line for the logic block to be programmed or reprogrammed. When all three of the X, Y and Z enable bits have been activated, the logic block selected by the data in the address field of the incoming bit stream is ready to receive configuration bits, since its block enable circuit will have been put in the enabled state. All other block enable circuits on the FPGA will still be in the disabled state at this point.

A decode 448 decodes the output of counter 432 to determine when the Dec and Settling bits have arrived. When they have, it is time to reset the logic block selected by the address field. The decoder 448 then clocks latch 464 which latch a logic 1 to assert the LOGIC BLOCK RESET signal on line 206 to cause the selected logic block to be reset.

When the down counter 432 has counted 32 bits and reached zero, it activates its terminal count output line 472. This line is coupled to the clock input of a latch 474, and causes this latch to latch a logic 1. This logic 1 level is output on line 392 as an activation of the END OF ADDRESS signal. This activation informs the DATALOAD circuit 390 in FIG. 4 that it may now begin counting the incoming data bits for purposes of generating proper address bits on bus 32 in FIG. 4 to control the decoders in the memory bytes of the selected logic block to activate a path to one of their memory cells.

Figure 13:
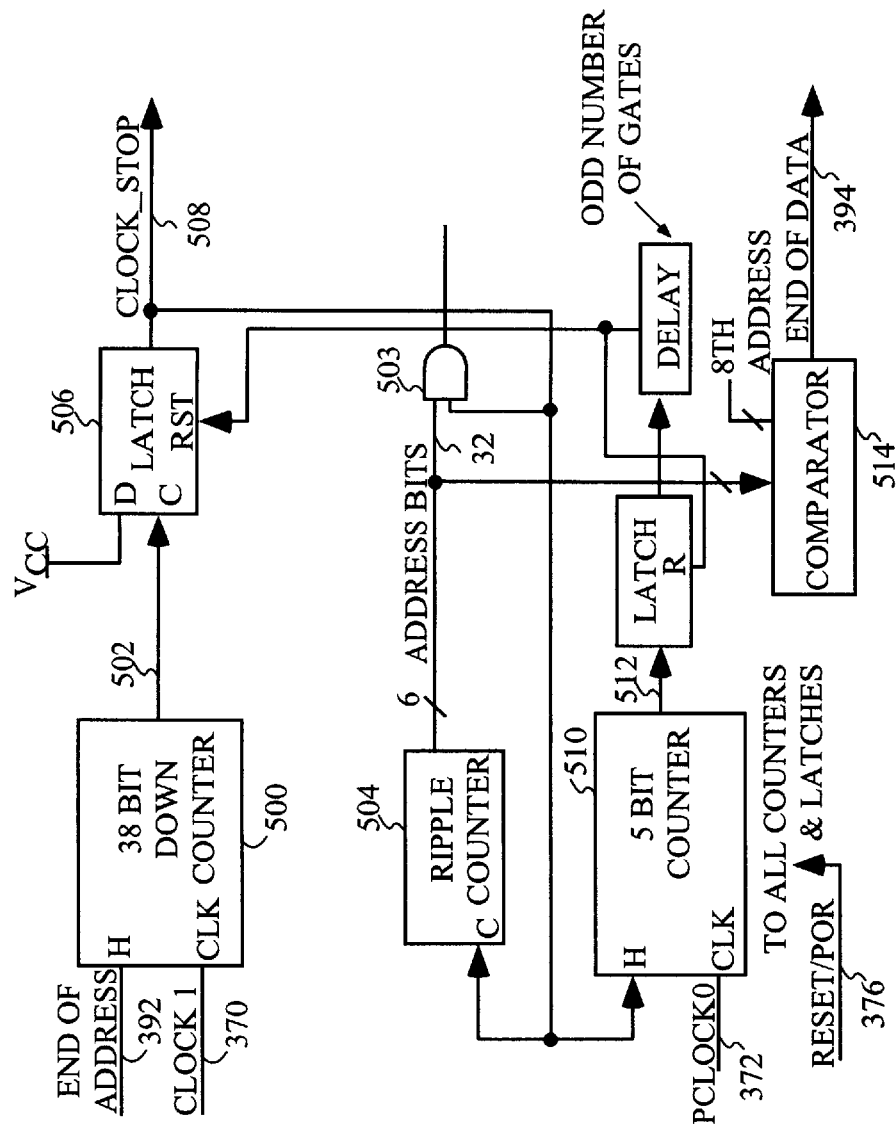
FIG. 13 is a block diagram of the DATALOAD circuit in the state machine.

Referring to FIG. 13, there is shown a block diagram of the DATALOAD circuit 390 in FIG. 4. The purpose of this circuit is to generate the appropriate address bits on bus 32 to control the decoders in all memory bytes of the selected logic block and to generate a CLOCK_STOP signal to stop the clocks during the 5 clock cycles of the write cycle when the configuration bits are copied from the serpentine shift register to the selected SRAM cells immediately following each filling of the serpentine shift register. The DATALOAD circuit also generates an END OF DATA signal which is activated and sent to the SYNCPASS circuit immediately following the end of each data field in a bitstream.

The DATALOAD circuit is comprised of a 38 bit down counter which has a hold input coupled to the END OF ADDRESS signal on line 392 and a clock input coupled to the CLOCK 1 signal on line 370. This counter is activated when END OF ADDRESS is activated and counts down the 38 configuration bits from the data frame being loaded into the serpentine shift register of the selected data block. The output of this counter on line 502 is low during the loading of the 38 bits into the serpentine shift register but goes high when the 38th cycle of CLOCK 1 has occurred indicating that the serpentine shift register in the selected logic block has been completely loaded and it is time to generate suitable address bits to copy the data through the decoders of the memory bytes on a path selected by the address bits. Ripple counter 504 is used to generate these address bits. The ripple counter is initialized by the RES ET signal at the beginning of each "load cycle" (a "load cycle" is the interval during which 38 configuration bits are loaded into a 38 bit serpentine shift register) to an all zero state such that all address bits on its output bus 32 are zero thereby shutting off all paths through the decoders of the memory bytes. The address bits generated by the ripple counter 504 are coupled to the gates of the transistors in the decoder through AND gate 503. The other input of this AND gate is coupled to receive the CLOCK_STOP signal generated by a latch 506. The CLOCK_STOP signal on line 508 is activated during the 5 clock cycles of the write interval. Therefore, the address bits generated by the ripple counter are coupled to the address bit inputs of the decoder only during the write interval when the CLOCK_STOP signal is active. When the 38th cycle of CLOCK 1 has been counted, line 502 goes high and the ripple counter is incremented by 1.

Line 502 is also coupled to the clock input of a latch 506, and when line 502 goes high, this latch latches a logic 1 therein. This activates a CLOCK_STOP signal on line 508. This signal is coupled to the clock tree circuit and causes it to stop the CLOCK 1 clock signal during the 5 cycles of the write interval. The PCLOCKO clock signal on line 372 is not stopped however when CLOCK_STOP is activated, and 5 cycles of this clock are counted by the 5 bit counter 510 in DATALOAD circuit 390 to time out the write interval. Line 508 is coupled to the hold input of a 5 bit counter 510 so activation of CLOCK_STOP when the serpentine shift register has been fully loaded causes this counter to begin counting out the 5 clock cycles of the write interval during which the configuration bits in the serpentine shift register are copied into the memory cells of the memory bytes in the selected logic block. During these five clock cycles, the data in the serpentine shift register are copied into the memory cells of each memory byte selected by the address bits on bus 32. Then 5 bit counter 510 reaches its terminal count and activates its output on line 512. This line is coupled to the reset input of latch 506 which deactivates CLOCK_STOP thereby restarting the CLOCK 1 clock signal so that the next 38 configuration bits of data from the data frame in the bit frame are shifted into the serpentine shift register of the selected logic block through the SYNCPASS circuit. The 38 bit down counter 500 then starts counting these 38 clock cycles, and when the 38th clock cycle occurs, it activates line 502 again which increments the ripple counter 504. This increments the address so that, if the "0" position memory cells were loaded on the last pass, the "1" position memory cells will be loaded on this pass. When all eight memory cells have been loaded, a comparator 514 detects this fact, and activates the END OF DATA signal on line 394. This signal activation causes the SYNCPASS circuit to start processing the address field, if any, of the next logic block to be loaded, or, if no other logic block is being loaded, then the stop field starts arriving and are detected by the stop comparator. The comparator 514 has one input coupled to bus 32 and the other input coupled to a hardwired set of levels representing the address that will be on bus 32 after the eighth memory cell has been loaded.

Figure 14A:
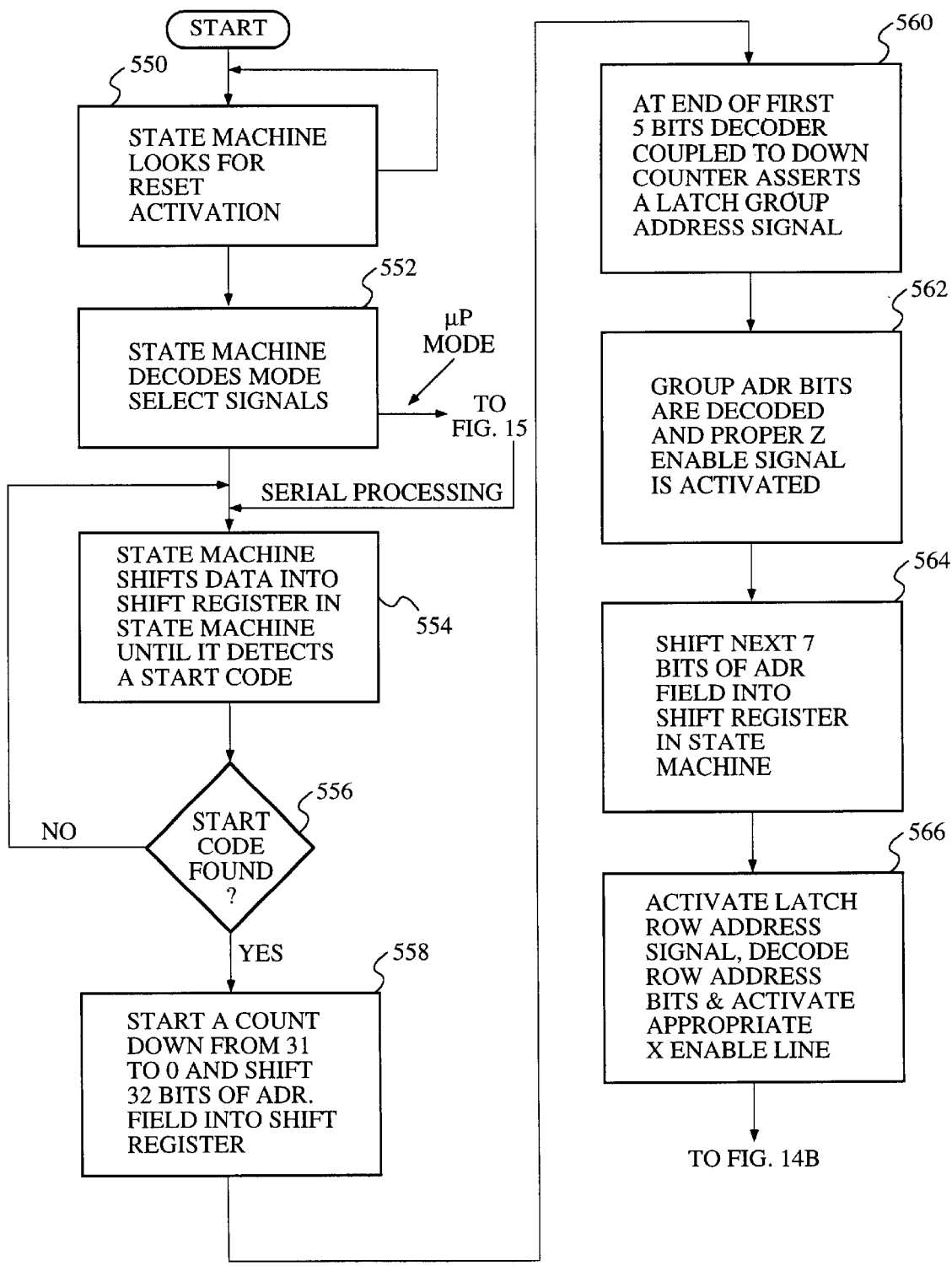
FIGS. 14A through 14C are a flow diagram of the process carried out by the preferred state machine for loading data in either of the serial modes.
Figure 14B:
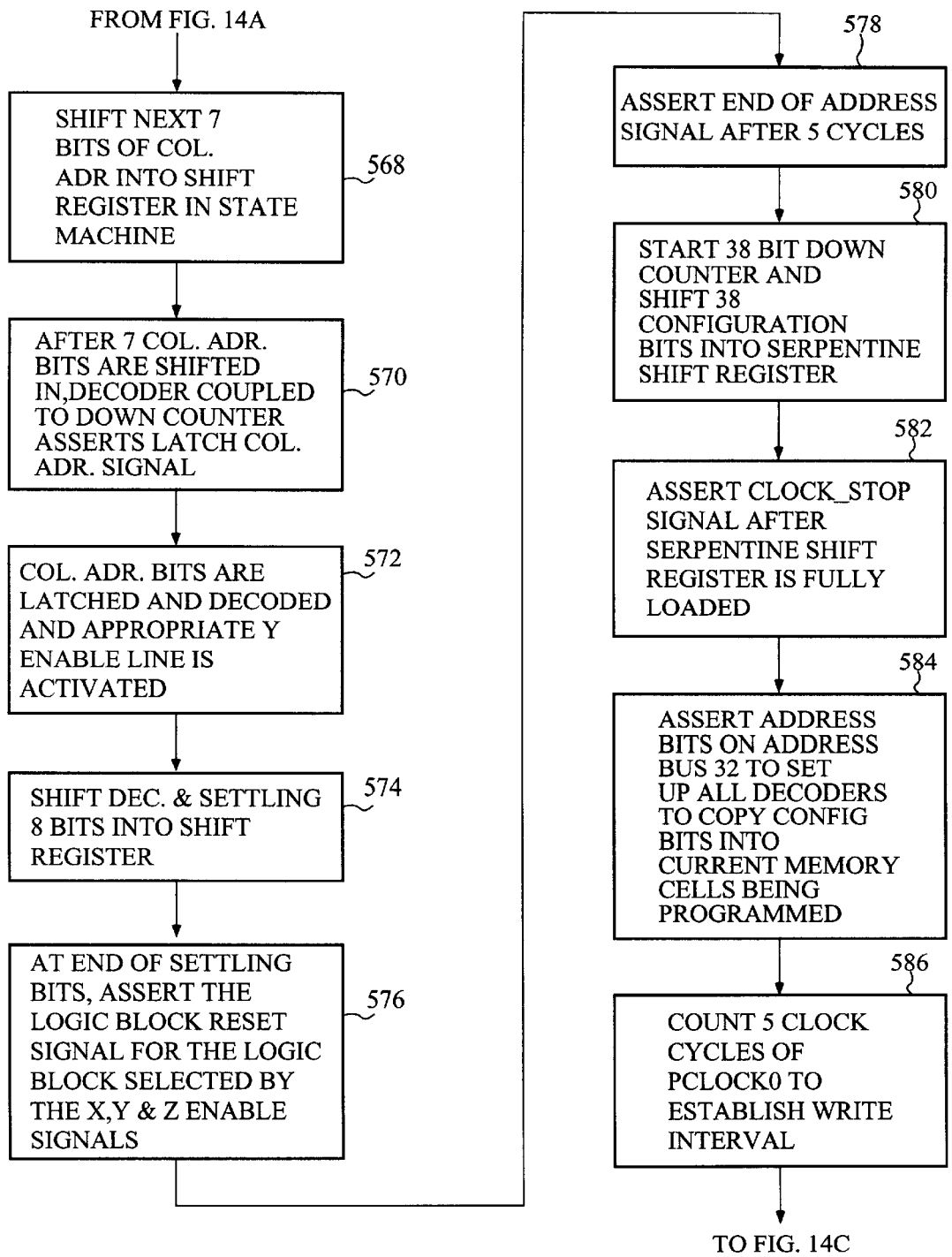
Figure 14C:
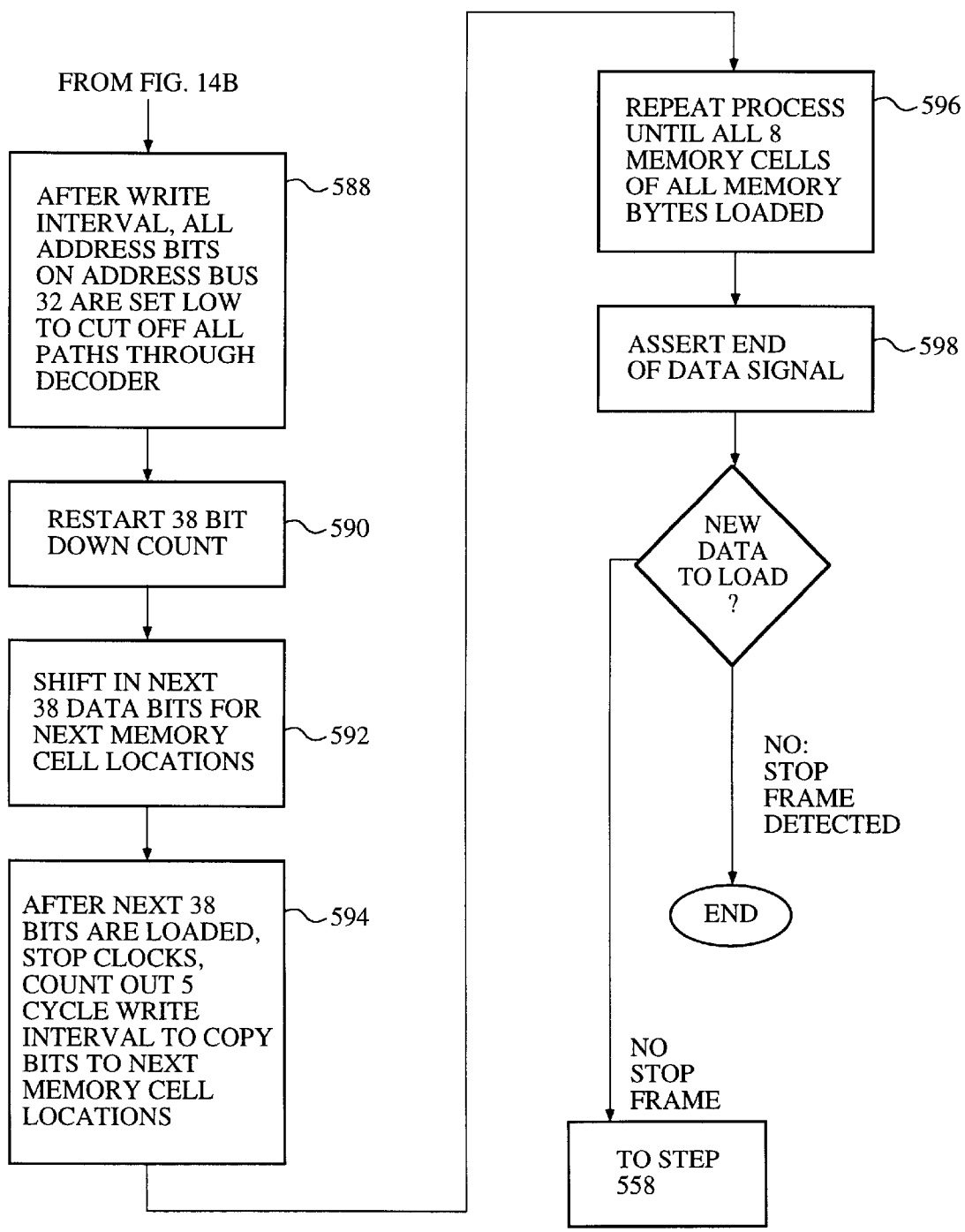

Referring to FIGS. 14A through 14C, there is shown a flow chart of the process carried out by the state machine in loading the serpentine register of the memory bytes of a selected logic block by processing the bits of the bitstream. Joint reference will be made to FIGS. 14A through 14C, FIG. 4 and FIG. 9, 10, 12 and 13. The first step in the process, represented by block 550, is to wait for a RES ET signal to occur on line 376 in FIG. 4. This signal is activated at power up and at the beginning of every cycle to program or reprogram the configuration bits of a logic block. Next, the mode decoder 352 decodes the mode signals on bus 350 in step 552 and generates the appropriate signals on line 354, 360 and 363 to control the various multiplexers to which these lines are connected and the oscillator 356 in accordance with the selected mode.

In step 554, the state machine shifts data into the shift register 406 in FIG. 12 until the start comparator 422 detects a start code comprised of the 32 bits of field 553 in FIG. 9. Test 556 represents the process of continuing to shift bits into the shift register 406 until the start code has been found.

Block 558 represents the process of starting a down counter to count the arrival of the 32 bits of the address field 559 in FIG. 9. This happens, in the preferred embodiment, when the start comparator 422 activates the START HIT signal on line 430 to cause counter 432 to start counting cycles of CLOCK 1 on line 370 which is the same clock signal which is being used to shift in the serial data of the address field.

Block 560 represents the process of detecting when the group address bits, 561 in FIG. 10, have arrived and asserting a signal that causes that portion of the address field to be latched. In the preferred embodiment, these steps are carried out by decoder 442, latch 450 and flip flop array 454.

Block 562 represents the process of decoding the group address bits just latched and activating the proper Z enable line of the group in which the desired logic block is resident. This is carried out by a group decoder now shown in FIG. 12 or 13 but which could be considered to be part of the SYNCPASS circuit in FIG. 4.

Block 564 represents the process of shifting the 7 bits of the row address field, 565 in FIG. 10, into the shift register 406 in FIG. 12.

Block 566 represents the process of recognizing when all the row address bits have arrived and asserting a LATCH ROW ADDRESS signal to latch the row address bits. These steps are done in the preferred embodiment by row decoder 444, latch 456 and flip flops in array 454. Block 566 also represents the process of decoding these row address bits and activating the appropriate X enable line for the logic block to be reprogrammed.

Block 568 represents the process of shifting the column address bits, 569 in FIG. 10, into the shift register 406. Block 570 represents the process of recognizing when the column address bits have all arrived and asserting a LATCH COLUMN ADDRESS signal. Block 572 represents the process of latching the column address bits, decoding them and asserting the appropriate Y enable line. At this point, the X, Y and Z enable lines of the logic block selected in the group, row and column address fields will be logic 1 and the block enable circuit for this logic block will be in the enabled state so that the data bus 22 and address bus 32 will be connected to the local data and address buses of the logic block and the local address and data buses of all other logic blocks will be isolated from the data bus 22 and address bus 32 of the state machine of FIG. 4.

Blocks 574 and 576 represent the processes of shifting the 8 Dec & Settling bits, field 571 of FIG. 10, into the shift register in the state machine and decoding them to determine the time to assert the Logic Block Reset signal on line 206 and asserting this signal. This time is immediately at the end of the 8 Dec & Settling bits. Because the block enable circuit of the selected block is now enabled, this assertion of the Logic Block Reset signal causes all the SRAM latches or other memory cells of only the selected logic block to be initialized to a known state in preparation for reprogramming. The process of blocks 574 and 576 in resetting the individual logic block selected by the address field in the bitstream is carried out by decoder 448 and latch 464 of FIG. 12.

Block 578 represents the process of asserting the END OF ADDRESS signal on line 392 in FIG. 12. This signal is asserted by latch 474 when counter 432 activates the terminal count signal on line 472.

The assertion of the END OF ADDRESS signal causes a 38 bit down counter 500 in FIG. 13 to start counting the clock cycles as the data bits from data field 501 in FIG. 9 are shifted into the 38 stage serpentine shift register of the selected logic block. This process is represented by block 580.

After the serpentine shift register has been fully loaded, a signal CLOCK_STOP on line 508 is asserted by latch 506 because counter 500 asserts its terminal count signal on line 502. This process is symbolized by block 582, and results in selected clock signals (all except PCLOCKO) being stopped during the 5 cycle write interval. Stopping all the clocks stops all processing by the SYNCPASS circuit.

Block 584 represents the process of asserting the proper address bits on global address bus 32 to set up all the decoders in all memory bytes of the logic block being programmed to copy the configuration bits in the serpentine shift register into the current memory cell. This is done by the ripple counter 504 in FIG. 13 which increments to its first of 8 counts upon the first activation of the terminal count signal on line 502 to load the "0" position memory cells after the first 38 bits of the data field have been loaded. When the counter 500 again activates its terminal count line 502, ripple counter 504 advances to the next count, and the next 38 bits in the data field will have been shifted into the serpentine shift register and copied into the "1" position cells.

Block 586 represents the process carried out by 5 bit counter 510 of counting out 5 clock cycles of PCLOCKO to establish the duration of the write interval during which the bits in the serpentine shift register are copied into the selected SRAM cells.

Block 588 represents the process of setting all address bits on global address bus 32 low after the write interval to cut off conductivity of all paths through the decoder so that the next 38 bits can be loaded into the serpentine shift register. This is accomplished by the 5 bit counter 510 in FIG. 13 resetting latch 506 when it reaches its terminal count after 5 cycles of PCLOCKO and asserts line 512. This deactivates CLOCK_STOP on line 508 thereby causing AND gate 503 to block the address bits.

The resetting of CLOCK_STOP restarts all the clock signals and causes 38 bit down counter to again begin counting clock cycles as the next 38 configuration data bits are shifted into the serpentine shift register. This process of restarting the 38 bit count and shifting these 38 bits into the serpentine shift register is symbolized by blocks 590 and 592. Block 594 represents the process of stopping the clocks after the new 38 bits have been loaded, and counting out a 5 cycle write interval while the bits are copied into the "1" position latches. This process is accomplished with the same circuits described above in the same way.

Block 596 represents the process of repeating the steps needed to load all the remaining memory cells of all memory bytes in the selected logic block. Block 598 represents the process of recognizing when all memory cells have been so loaded, and asserting the END OF DATA signal and repeating the steps of reading the group, row and column address fields of any additional address frame 559 following the data frame just processed and then storing the configuration bits in an associated data frame 501 in the memory bytes of whatever logic block is selected in the new address frame. Assertion of the END OF DATA signal is done by comparator 514 in FIG. 13 which monitors the address bits on bus 32 and compares them to the address of the last memory cell to be loaded.

Figure 15:
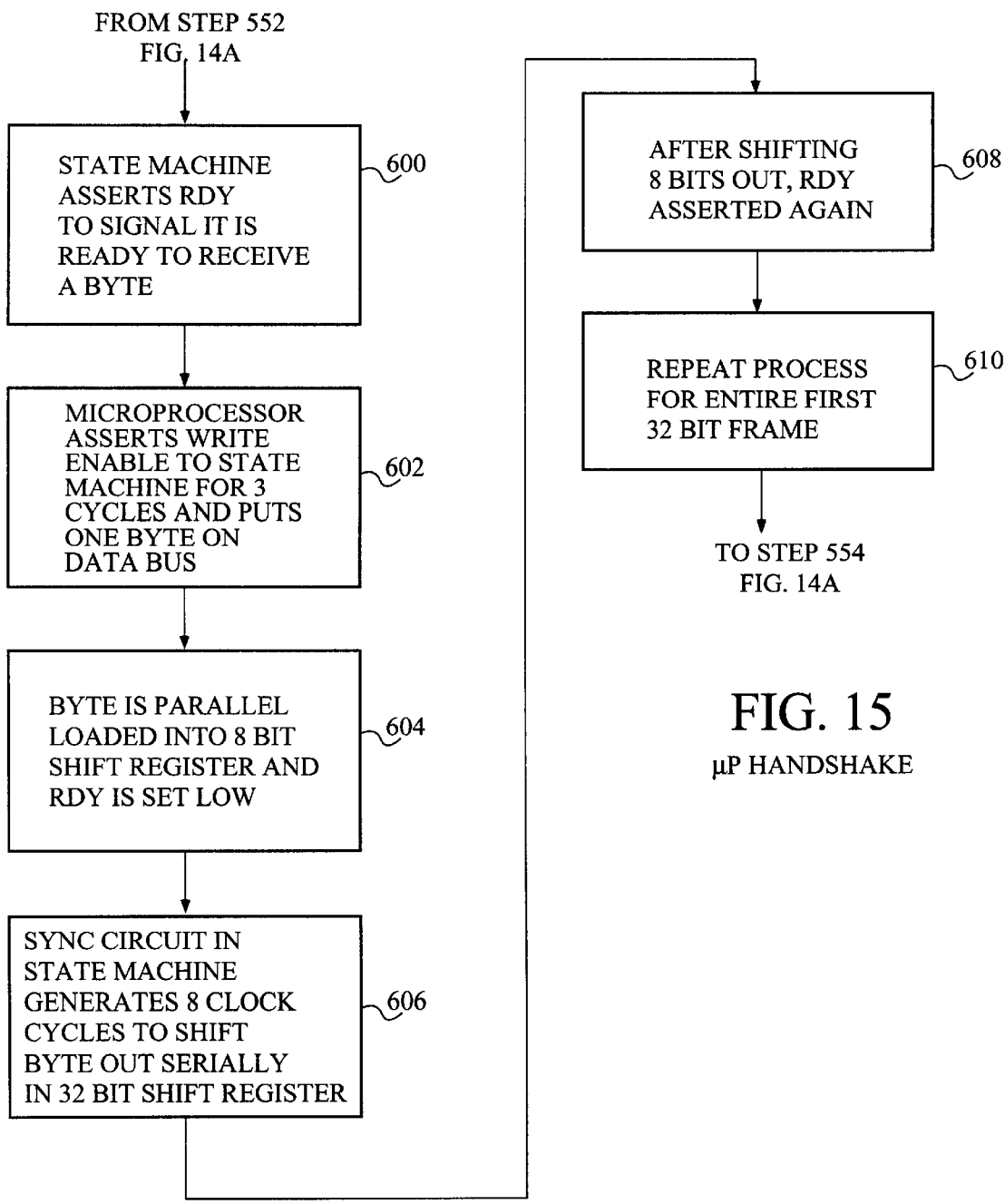
FIG. 15 is a flow diagram of the process for handshaking between an external microprocessor and the state machine to load data during the microprocessor mode.

As described above, the process of loading configuration bits in processor mode is very similar except for a handshaking process between the state machine and an external microprocessor to load the bits of the bit frame in parallel. After they are loaded in parallel into 8 bit shift register 381, they are shifted out in serial format, and, thereafter, processing follows the serial process described above in FIGS. 14A through 14C from step 554 and following. FIG. 15 is a flow chart of the details of the handshaking processing.

If step 552 in FIG. 14A determines that processor mode is in effect, processing branches to step 600 on FIG. 15. There the SYNC circuit on FIG. 4 asserts RDY to tell the external microprocessor it is ready to receive a byte. In block 602, the microprocessor asserts a WRITE ENABLE signal on line 361 and puts a byte of data on all 8 lines of data bus 374. Assertion of WRITE ENABLE causes the SYNC circuit to activate the LOAD BYTE signal. This causes 8-bit shift register 381 in FIG. 12 to load the 8 bits from the bit frame in parallel into the shift register, as symbolized by block 604. Block 606 represents the process carried out by the SYNC circuit of generating the 8 clock cycles of SHIFT BYTE using the clock of line 366 to establish the frequency and phase. These 8 clock cycles cause shift register 381 to shift the 8 bits out serially on output line 402. Multiplexers 400 and 408 are controlled to send these 8 serial bytes into 32 bit shift register 406 and simultaneously out on data bus 22. They do not go anywhere on bus 22 since no block enable circuit has yet been enabled. Block 608 represents the process of asserting RDY again to receive the next byte. Block 610 represents the process of repeating this procedure until 32 bits of the bit frame have been shifted into shift register 406. The bits are then processed as described in FIGS. 14A–14C until the start code has been detected. Then the handshaking process begins again to load the 32 bits of the address field. Then the serial processing of FIGS. 14A–14C is performed to generate the X, Y and Z enable signals and clear the memory cells of the selected logic block. Then the handshaking process of FIG. 15 is performed again to load the first 38 bits of the data field into the serpentine shift register. Then the processing of FIG. 14A–14C is performed to copy these bits into the "0" position memory cells, and the handshaking and serial data processing process is repeated until all memory cells have been loaded.

Figure 5:
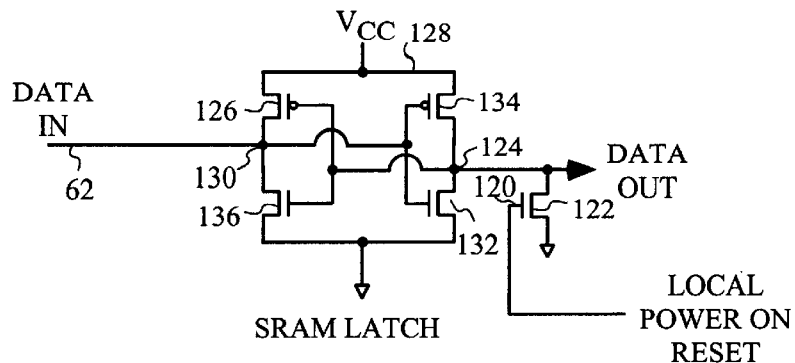
FIG. 5 is a schematic diagram of the preferred SRAM latch.

FIG. 5 is circuit diagram of the preferred form of volatile SRAM cell. This cell is similar to any standard SRAM latch, but not identical, although any standard SRAM latch can be made to work in the memory configuration according to the invention. The SRAM cell of FIG. 5 is a regenerative latch using cross coupled CMOS inverters for single ended write and single ended read operations. At power up time, the gate 120 of transistor 122 is driven high (logic 1) by a local Power On Reset signal. This pulls node 124 low (logic 0) which causes PMOS transistor 126 to turn on. When transistor 126 turns on, the Vcc supply on node 128 is coupled to node 130 which turns NMOS transistor 132 on. When transistor 132 turns on, it grounds node 124 which keeps PMOS transistor 126 on and turns transistor 136 off. The Vcc voltage coupled by transistor 126 to node 130 keeps PMOS transistor 134 off and establishes a stable state in all SRAM latches storing a logic 0 with node 124 low and node 130 high. In each memory byte, there are eight power-on reset transistors like transistor 122, as is symbolized by the eclipses next to transistor 122 in FIG. 1. Each of these eight transistors has its source coupled to ground and its drain coupled to the analog of node 124 in the SRAM latch associated with that transistor.

When this SRAM latch is written, the intent is to store a logic 1 therein by reversing the states of the voltages on nodes 124 and 130. To write a logic 1 into the latch of FIG. 5, the data input line 62 coupled to one output of the one-of-eight decoder is driven low. The low on line 140 turns PMOS transistor 134 on which couples Vcc to node 124, and it turns NMOS transistor 132 off thereby allowing node 124 to remain high. The Vcc voltage on node 124 turns NMOS transistor 136 on which holds node 130 low and it also turns PMOS transistor 126 off. Thus, the other of two bistable states is established with node 124 high and node 130 low.

One of the advantages of the partitioned or packetized nature of the memory architecture of the invention, it is possible to group small groups of configuration memory cells with the logic blocks that the cells control. For example, in the FPGA described in the patent application previously incorporated by reference, the logic blocks are arranged in an array and vertical and horizontal buses are routed between the columns and rows of the array. Each logic block includes drivers that can be programmed to drive signals from the internals of the logic block onto the vertical buses and multiplexers that can be programmed to couple the signals on the horizontal buses into the logic block. The vertical buses include drivers that can be programmed to drive signals from the vertical buses onto lines of the horizontal buses. Further, the vertical and horizontal buses includes periodically spaced bidirectional active links that can be programmed to be on or off. This allows various lines of the vertical and horizontal buses to be segmented or coupled together. This use of active links means that the amount of parasitic capacitance coupled to any driver is predictable for any routing of a signal. This allows the design of the drivers to be optimized to drive the known loads they will have to drive. The segmentation by active links and its benefits are explained in greater detail in the patent application incorporated by reference herein.

The segmentation of the configuration memory into the memory byte structure described herein allows better optimization of each logic block in the FPGA. Because of the segmentation of the configuration memory, just enough memory cells to program all the necessary switches, drivers, multiplexers and active links in and around each logic block may be physically grouped together and placed nearby the switches, drivers, multiplexers and active links being programmed. Typically, the memory byte cells are placed along the edges of the logic blocks or in the corners thereof. This means that each logic block is optimized because the configuration signals do not have to travel far to the device being controlled. Because there is no need for word lines or bit lines or the regularity imposed thereby, the cells of the memory bytes can be placed where it is convenient to place them in the layout of the integrated circuit to optimize the layout of each logic block. This freedom of choice in layout also reduces the number of high speed data signals that have to be routed over the memory cells. This eases the shielding problem. For example, the freedom to put the memory bytes in more places led to a choice to allow the horizontal buses to run over the top of some configuration memory cells. However, since the horizontal bus in on the metal 3 layer, and the cells of the memory bytes are much lower in the integrated structure, the metal 2 layer can be used to shield the cells of the memory bytes.

ADVANTAGES

One of the advantages of SRAM based FPGAs is that simply by changing the ROM, the functionality can be changed from one power up cycle to another. This greatly enhances and speeds up design cycles since it makes design changes in the FPGA easier, cheaper and faster to make.

Because there are no word lines and no bit lines in the memory array of FIG. 2, the restrictions imposed by the need to have a more or less regular array comprised of a matrix of word lines and bit lines in prior FPGAs with logic blocks in the interstices of the matrix is eliminated.

In an alternative embodiment, the flip flops of all the memory bytes may be loaded simultaneously in parallel. In such an embodiment, the flip flops are not connected as a serpentine shift register, but each has its own data input line which is coupled to a source of a configuration bit. In integrated circuit configurations, this may be impractical in cases where the sources of the configuration bits are off the chip because of the limitation in pins available. However, in the future as linewidths continue to shrink and packaging technology improves, it may be possible to bring every data input of a flip flop out to an external pin. In another alternative embodiment, a number of pins less than the number of flip flops may be used and these pins can be connected to the flip flops through multiplexers. In this embodiment, for example, one pin could be used to load 20 flip flops through a one-input, twenty-output multiplexer. In such an embodiment, a source of configuration data can be external to the FPGA and provide the configuration bits to load the twenty flip flops to the single FPGA pin devoted to those twenty flip flops. The configuration data is provided in serial fashion one bit at a time during each of twenty successive clock cycles in the sequence in which the multiplexer is operated. During each of twenty clock cycles, the multiplexer is operated to connect the external pin to one of the twenty flip flops, and the sequence in which the flip flops are loaded is the sequence in which the configuration bits are presented at the pin. The decoder(s) coupled between the twenty flip flops and their associated twenty static RAM latches are operated to shut off all paths to the inputs of the static RAM latches during loading of the flip flops. When all twenty flip flops have been loaded in this manner with the configuration bits for the "0" position, the decoders can be operated to couple all the flip flop outputs to the "0" position static RAM latch data inputs. The process is then repeated for the "1" position static RAM latch data inputs. The same process can be carried out at another pin dedicated to loading another twenty flip flops (or any other number) associated with twenty more static RAM cells and so on for as many pins as are required to load all the static RAM cells needed to configure the FPGA. The advantage of this type embodiment is that it eliminates the complexity of the need for a state machine or programmable machine to be fabricated on the FPGA as an external microprocessor can be programmed to present the data to the pins and to control the addressing inputs of the decoders.

In still another embodiment, the flip flops can be eliminated and the decoder data inputs can be coupled to the external pins dedicated to loading configuration data through multiplexers. In this embodiment, the configuration bits to load the "0" position static RAM latches of all the memory bytes may be supplied to multiple pins simultaneously by an external computer, state machine or microprocessor, and the external computer etc. can then supply addressing signals to all decoders such that the data supplied to the external pins are coupled from each pin through the corresponding decoder path to the "0" position static RAM latch where it is latched. The addressing bits for the decoders are then changed to set up conductive paths to the "1" position static RAM latches, and the data for these latches is then supplied to the pins by the external computer or state machine. In this embodiment, the decoders/multiplexers can be made larger in accordance with the number of static RAM latches that need to be loaded versus the number of external FPGA pins available. As pins are usually scarce and available at a premium in complex FPGAs, the two alternative embodiments discussed above are probably more practical in future technologies where more pins than are needed for the logic block data input and data output signals themselves are available.

Generally, since the flip flops only need to be loaded eight times, each time the configuration of the FPGA is to be established, it is more practical with present integrated circuit technology to connect the flip flops as a serial data input serpentine shift register and shift the data in serially from an on-board state machine and ROM. This eliminates the need for a pin for every flip flop or sharing of pins using multiplexers or big decoders.

Another alternative embodiment is to replace the SRAM latches with nonvolatile memory cells such as EEPROM memory cells. In such an embodiment, suitable programming circuitry would be added to apply the necessary high programming voltages selectively to some of the control gates to cause tunneling of charge carriers into the floating gates from the substrate. Suitable shielding must be done in the layout of the integrated circuit to prevent any lines carrying high programming voltages from causing breakdowns or punch throughs that could destroy the integrated circuit. The EEPROM cells that have charge on their floating gates would store in nonvolatile fashion and output one of the two binary logic states, and the ones with no charge on their floating gates would store and output the other binary state. Read circuitry to supply the stored binary states to the switches in the logic blocks of the FPGA would also be added. Such EEPROM read and write circuitry is well known in the art, and can be adapted by routineers to the memory architecture described herein. Basically, the memory architecture as modified to use EEPROM cells instead of SRAM latches operates as follows. The flip flops are loaded with the configuration data in any of the processes described above. In the case of the alternative embodiment where the flip flops have been eliminated, the individual FPGA pins are coupled via individual decoders to the data inputs of the EEPROM cell. In either case, the configuration bits stored in the flip flops or supplied from external pins directly through the decoder without the use of flip flops are supplied to the EEPROM write circuitry to control which of the EEPROM cells receives a high programming voltage to charge its floating gate and which do not. For example, if a logic 1 is stored in the particular EEPROM cell technology chosen by charging the floating gate with negative charge, then all flip flops which store logic 1 or all pins supplying logic 1 configuration bits will cause the EEPROM write circuitry to steer the high programming voltage to the control gates of only the EEPROM cells that correspond to the flip flops or pins having logic 1 and all other EEPROM cells will not receive the programming voltage. Use of the phrase "high programming voltage" is not intended to exclude any of the know EEPROM technologies which are capable of being programmed with voltages lower than the typical 10 volt programming voltage used in many first generation EEPROM technologies.

The configuration bits stored in the EEPROM cells can be read out in any of the known ways of reading bits. For example, if an EEPROM cell storing a logic 1 has its threshold voltage $V_t$ lowered to some low voltage, for example 0 or 1 volt while the threshold voltages of the EEPROM cells storing logic 0 are 3 volts, a 2 volt source to drain potential difference could be applied to all EEPROM cells, with their drains connected to pullup resistors. Any EEPROM cell storing a logic 1 would conduct in such a circumstance and cause a voltage drop across its pullup resistor which could be applied directly or indirectly to a switch to be controlled in a logic block. Any EEPROM technology compatible with the FPGA technology chosen and any read or write circuitry compatible with the above described process of programming and using EEPROM to control an FPGA will suffice to practice this particular subgenus within the genus of the invention The advantage of the nonvolatile cell embodiments are at least two. First, the delay of reprogramming all the SRAM cells every time at power up is eliminated. Second, since there are no word lines and bit lines that criss-cross the entire die, there is no problem with having to charge such word lines and bit lines with high programming voltages to program individual nonvolatile cells spread out throughout the FPGA. All the nonvolatile cells can be grouped in one location on the die and the high voltage lines can be restricted to that area. This eliminates possible sources of failure caused by voltage breakdowns along the word line or bit lines whenever programming voltages are applied. The memory configuration of the invention also eliminates the need to design the FPGA with thicker insulation layers to resist breakdown under the stress of the programming voltages which are much higher than normal operating voltages.

FIG. 4 is a block diagram of the preferred form of state machine for use in loading the configuration bit in an embodiment of the memory using a serpentine shift register of flip flops.

FIG. 5 is circuit diagram of the preferred form of volatile SRAM cell. This cell is similar to any standard SRAM latch, but not identical, although any standard SRAM latch can be made to work in the memory configuration according to the invention. The SRAM cell of FIG. 5 is a regenerative latch using cross coupled CMOS inverters for single ended write and single ended read operations. At power up time, the gate 120 of transistor 122 is driven high (logic 1) by a local Power On Reset signal. This pulls node 124 low (logic 0) which causes PMOS transistor 126 to turn on. When transistor 126 turns on, the Vcc supply on node 128 is coupled to node 130 which turns NMOS transistor 132 on. When transistor 132 turns on, it grounds node 124 which keeps PMOS transistor 126 on and turns transistor 136 off. The Vcc voltage coupled by transistor 126 to node 130 keeps PMOS transistor 134 off and establishes a stable state in all SRAM latches storing a logic 0 with node 124 low and node 130 high. In each memory byte, there are eight power-on reset transistors like transistor 122, as is symbolized by the eclipses next to transistor 122 in FIG. 1. Each of these eight transistors has its source coupled to ground and its drain coupled to the analog of node 124 in the SRAM latch associated with that transistor.

When this SRAM latch is written, the intent is to store a logic 1 therein by reversing the states of the voltages on nodes 124 and 130. To write a logic 1 into the latch of FIG. 5, the data input line 62 coupled to one output of the one-of-eight decoder is driven low. The low on line 140 turns PMOS transistor 134 on which couples Vcc to node 124, and it turns NMOS transistor 132 off thereby allowing node 124 to remain high. The Vcc voltage on node 124 turns NMOS transistor 136 on which holds node 130 low and it also turns PMOS transistor 126 off. Thus, the other of two bistable states is established with node 124 high and node 130 low.

One of the advantages of the partitioned or packetized nature of the memory architecture of the invention, it is possible to group small groups of configuration memory cells with the logic blocks that the cells control. For example, in the FPGA described in the patent application previously incorporated by reference, the logic blocks are arranged in an array and vertical and horizontal buses are routed between the columns and rows of the array. Each logic block includes drivers that can be programmed to drive signals from the internals of the logic block onto the vertical buses and multiplexers that can be programmed to couple the signals on the horizontal buses into the logic block. The vertical buses include drivers that can be programmed to drive signals from the vertical buses onto lines of the horizontal buses. Further, the vertical and horizontal buses includes periodically spaced bidirectional active links that can be programmed to be on or off. This allows various lines of the vertical and horizontal buses to be segmented or coupled together. This use of active links means that the amount of parasitic capacitance coupled to any driver is predictable for any routing of a signal. This allows the design of the drivers to be optimized to drive the known loads they will have to drive. The segmentation by active links and its benefits are explained in greater detail in the patent application incorporated by reference herein.

The segmentation of the configuration memory into the memory byte structure described herein allows better optimization of each logic block in the FPGA. Because of the segmentation of the configuration memory, just enough memory cells to program all the necessary switches, drivers, multiplexers and active links in and around each logic block may be physically grouped together and placed nearby the switches, drivers, multiplexers and active links being programmed. Typically, the memory byte cells are placed along the edges of the logic blocks or in the corners thereof. This means that each logic block is optimized because the configuration signals do not have to travel far to the device being controlled. Because there is no need for word lines or bit lines or the regularity imposed thereby, the cells of the memory bytes can be placed where it is convenient to place them in the layout of the integrated circuit to optimize the layout of each logic block. This freedom of choice in layout also reduces the number of high speed data signals that have to be routed over the memory cells. This eases the shielding problem. For example, the freedom to put the memory bytes in more places led to a choice to allow the horizontal buses to run over the top of some configuration memory cells. However, since the horizontal bus in on the metal 3 layer, and the cells of the memory bytes are much lower in the integrated structure, the metal 2 layer can be used to shield the cells of the memory bytes.

SEPARATELY ADDRESSIBLE BLOCKS

The memory byte architecture of the genus of the invention has the advantage that any memory byte may be separately addressed and its contents changed without affecting the contents of any other memory byte. In other words, suppose a designer wishes to change the programming of just one logic block to alter its functionality, or desires to route a particular signal differently to change delays etc. and needs to change the segmentation on various lines of the vertical and/or horizontal buses. With the memory byte architectecture, he or she can separately address just the particular memory cell or cells in the configuration memory that need to have their contents changed and change them. This can be done without risking inadvertent changes in other memory cells.

In prior art FPGA configuration memory structures having uniform word and bit lines, this was not possible. To change the contents of a particular memory cell in the prior art configuration memories, the appropriate word line would have to be turned on and then the new data placed upon the appropriate word line. Because the word line that is driven high in this process is coupled to pass transistor gates of every memory cell in its row, there is a risk that any bit line that has a voltage on it other than the voltage needed to maintain the data state of the cell at the intersection of that bit line and the word line might have its data state inadvertently altered. This is especially true since the SRAM cells in prior art FPGAs have two bit lines, one for each node so activity on the side of the cell from which the stored bit is read can also change the stored bit. In other words, whenever a word line is turned on, all cells in the row of that word line are given access to their bit lines including cells which have already been programmed. Even if the bit lines coupled to the cells already programmed are in a high impedance state, noise spikes on the bit line picked up by inductive coupling to high speed data lines, EMI etc. can cause an already programmed cell to have its data state altered.

Figure 6:
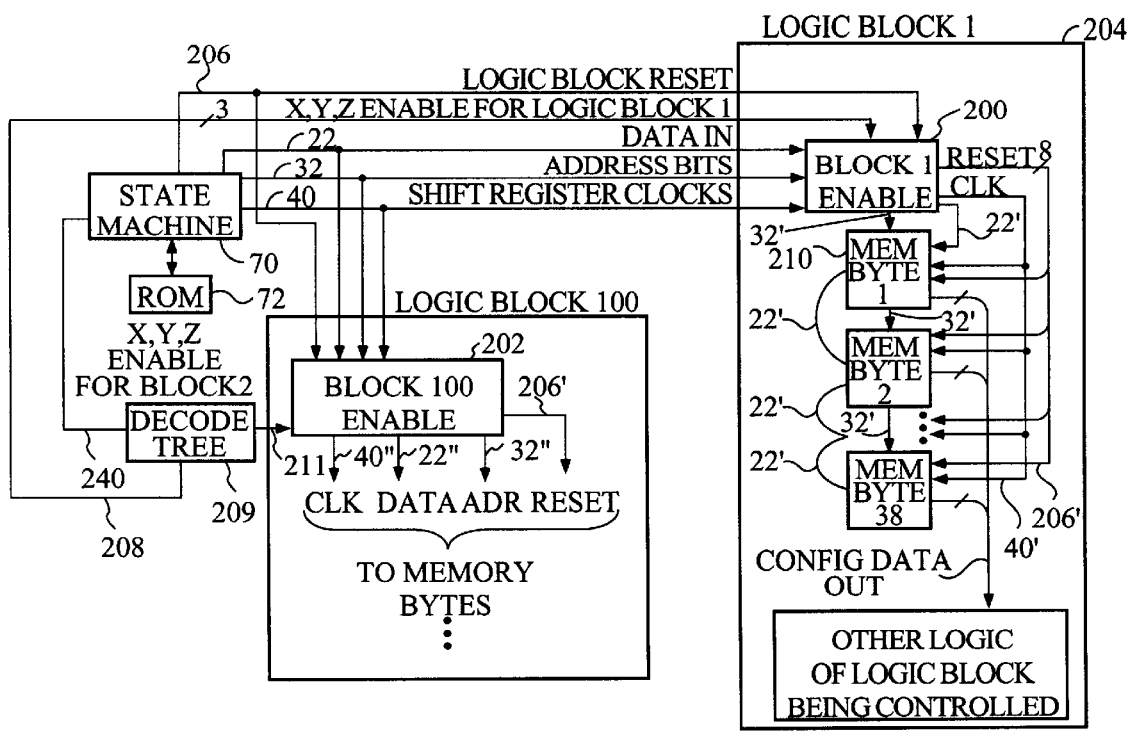
FIG. 6 is a block diagram of a portion of an FPGA which provides individual addressibility of the configuration memory cells of each logic block without affecting any memory cells in any other logic block.

In contrast, with the one-of-eight decoder structure and shift register architecture, access to the data inputs of the SRAM latches is strictly controlled. The memory bytes can be grouped together into a plurality of functional groups that divide the logic blocks of the FPGA into functional groups that can be individually programmed by programming the corresponding memory byte group without affecting the programming of any other memory byte groups. In other words, there will be multiple serpentine shift registers, each assigned to one group of memory bytes and a corresponding group of switches in a logic block and drivers and active repeaters etc. being controlled by the configuration bits in the group of memory bytes. This concept is illustrated in FIG. 6 where an embodiment of an FPGA configuration memory is shown with 38 memory bytes per logic block and one serpentine shift register per logic block, each shift register comprised of the flip flops of the 38 memory bytes included within the logic block. Each group of 38 memory bytes is individually addressable and can be rewritten without affecting the data stored in the memory bytes of any other logic block.

Individual addressibility of the memory bytes of each logic block in the FPGA is provided by enable circuits of which the Block 1 Enable circuit 200 and the Block 100 Enable circuit 202 are typical examples. Each enable circuit of each logic block functions as an individually addressible gate circuit which can be turned on or turned off. When the gate circuit is turned off, it blocks data, clock, address, and block reset signals from reaching the 38 memory bytes of that logic block.

More specifically, each logic block enable circuit receives several inputs from the state machine 70, and every block enable circuit receives the same global signals. These global signals are: the Data In serial bus 22; the six bit address bus 32 and the clock bus 40 carrying the TR and CK clock signals and the LOGIC BLOCK RESET signal on bus 206. Each block enable circuit also receives individualized addressing signals comprised of X, Y and Z enable signals which are generated by a decode tree circuit 209. This circuit receives as its inputs X, Y and Z enable signals from the state machine 70 in FIG. 6 via bus 240. There are 5 Z lines, 4 X lines and 4 Y lines in bus 240, all of which are generated by the state machine. The decode tree circuit 209 takes these X, Y and Z lines on bus 240 and generates from them the final X, Y and Z address lines which are transmitted to each logic block. In the case of logic block 1 shown at 204, these X, Y and Z lines are the three lines of bus 208. In the case of logic block 100, the three X, Y and Z lines are on bus 211.

For logic block 1, shown at 204, Block 1 Enable circuit 200 receives a global Logic Block Reset signal on line 206 and individual logic block 1 enable signals comprised of three signals collectively referred to as X, Y and Z Enable for Logic Block 1 on bus 208 from the decode tree. When the state machine wishes to load configuration data into the memory bytes of any particular logic block and only that logic block, it enables the X, Y and Z enable signals on bus 240 in such a manner that the decode tree 209 activates X, Y and Z enable signals for only that particular logic block. Thus, to load or reconfigure the configuration bits for Logic Block 1, the decode tree 209 sets all three X, Y and Z signals on bus 208 to logic 1. This causes the Block 1 Enable circuit 200 to unblock the data, clock, reset and addressing signal lines thereby connecting the state machine to the 38 memory bytes of Logic Block 1.

More specifically, when the X, Y and Z enable signals for Logic Block 1 on bus 208 are all high, the Data In serial bus 22 is coupled to the serial data input 22' of the first flip flop in Memory Byte 1 (shown at 210) of the 38 memory byte serpentine shift register dedicated solely to Logic Block 1. Likewise, the global address bits for the decoders on bus 32 are coupled to the local address bits on bus 32', and the shift register clock signals CK and TR and their inverse signals on bus 40 are coupled to the local clock bus 40' for Logic Block 1. The state machine then manipulates the data on the Data In line 22 and the address bits on bus 32 and the clock signals as defined herein to load configuration bits into the serpentine shift register of Logic Block 1 and from there into the SRAM latches or other memory cells. Also, when the Block 1 Enable circuit 200 is in the enabled state (inputs connected to appropriate outputs), the Logic Block Reset signal on line 206 is coupled to a local Logic Block 1 Reset bus 120 and can be asserted to reset all configuration bits in the SRAMs or other memory cells to the initialized state to prepare for loading of new configuration bits.

While the loading of the new configuration bits into logic block 1 is happening, none of the data, addressing or clock signals on buses 22, 32 or 40 are getting to the memory byte circuitry of logic block 100 or any other logic block. This is because only the Block 1 Enable circuit 200 is enabled and all the other block enable circuits are disabled. When the user wishes to load new data into Logic Block 100, a bitstream or bit frame is provided from external pins to state machine 70. The bitstream is decoded and causes the X, Y and Z signals on bus 240 to be set to such a state that the decode tree 209 activates the X, Y and Z enable signals on bus 211 for logic block 100. This places the Block 100 Enable circuit 202 in the enabled state. This couples the data, address and clock signals on buses 22, 32 and 40 to the corresponding local data, address and clock buses designated 22", 32" and 40" and connects a Logic Block 100 Reset signal on bus 242 to the local block reset bus 206'. Logic Block 100 is now in a state wherein its configuration bits can be reset to the initialized state and new configuration bits can be loaded according to any of the loading processes described herein.

Figure 7:
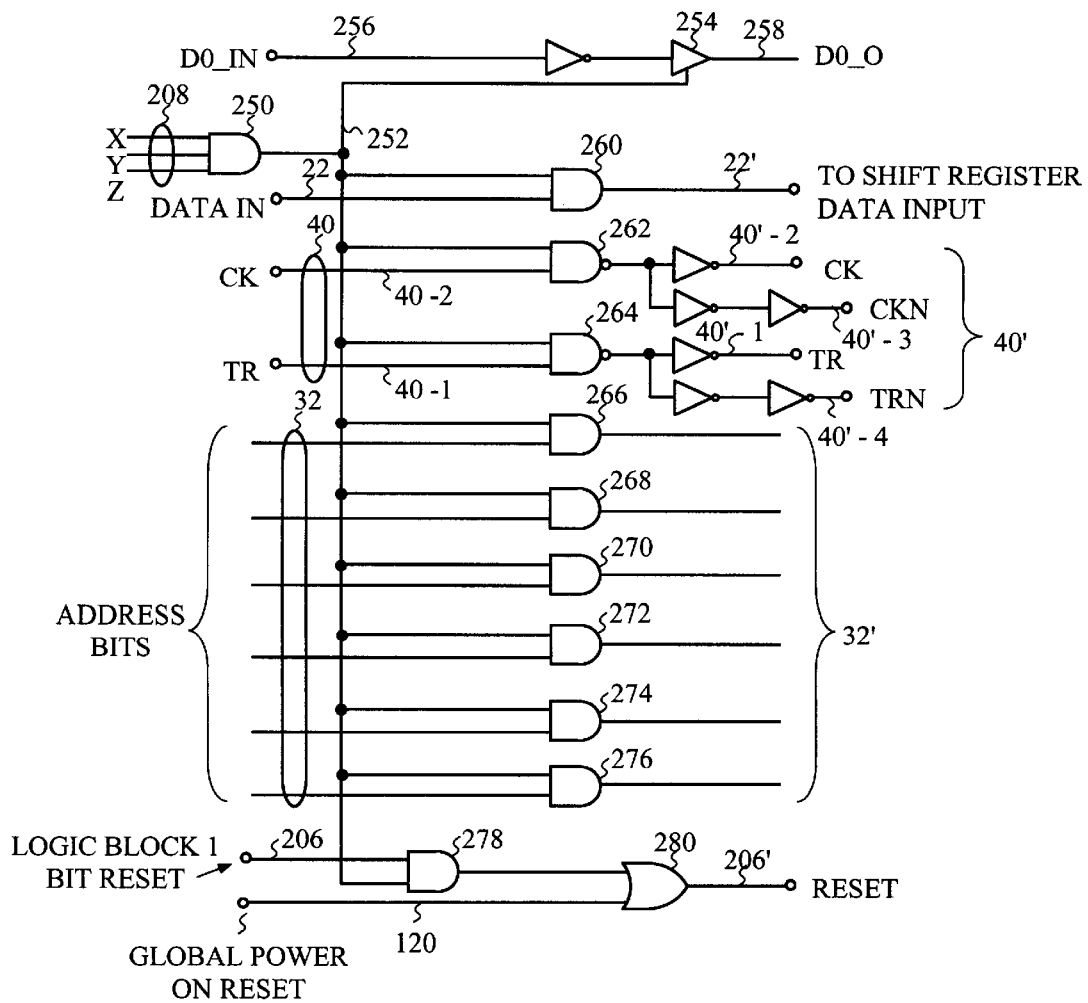
FIG. 7 is a detailed schematic of the block enable circuit for every logic block.

FIG. 7 shows the details of the block enable circuits using the Block 1 Enable circuit 200 as an example. AND gate 250 receives the X, Y and Z enable signals, and when they are all high, drives enable line 252 high. When line 252 is high, a plurality of AND gates and NAND gates which are coupled to this signal are enabled to pass the other signal at their inputs through thereby coupling the state machine to the local buses. Line 252 is also coupled to the enable input of a tristate buffer 254, and when line 252 is high, a DO_IN data input line 256 is coupled through an inverter to a DO_O output line. This connection is used in debug operations when the data in the SRAM latches or other memory cells is read back out through the one-of-eight decoders of all memory bytes in the logic block into the flip flops into the serpentine shift register and are then shifted out for determination if they are correct.

AND gate 260 couples the global Data In line 22 to the local bus 22' connected to the data input of the serpentine shift register when line 252 is high.

NAND gates 262 and 264 coupled the clock signals CK and TR on bus 40 to the local clock bus 40' and to a pair of inverter pairs which generate the complements CKN and TRN of each of the CK and TR clock signals such that the local clock bus 40' comprises CK, TR, CKN and TRN.

AND gates 266, 268, 270, 272, 274 and 276 all couple global address bits on bus 32 onto the local address bus 32' to control the conductive path in the one-of-eight decoder of each memory byte in the logic block when line 252 is high.

AND gate 278 couples the global Logic Block Reset signal on bus 206 to the local reset bus 206' through OR gate 280 when line 252 is high. The global power on reset signal which is asserted at power up time on line 120 is coupled to local reset line 206' through OR gate 280. The local reset line 206' is coupled to the individual gates of NMOS reset transistors like transistor 122 in FIG. 1. There is one transistor for each SRAM latch. Each of these transistors is coupled to its SRAM cells as shown in FIG. 5.

Figure 8:
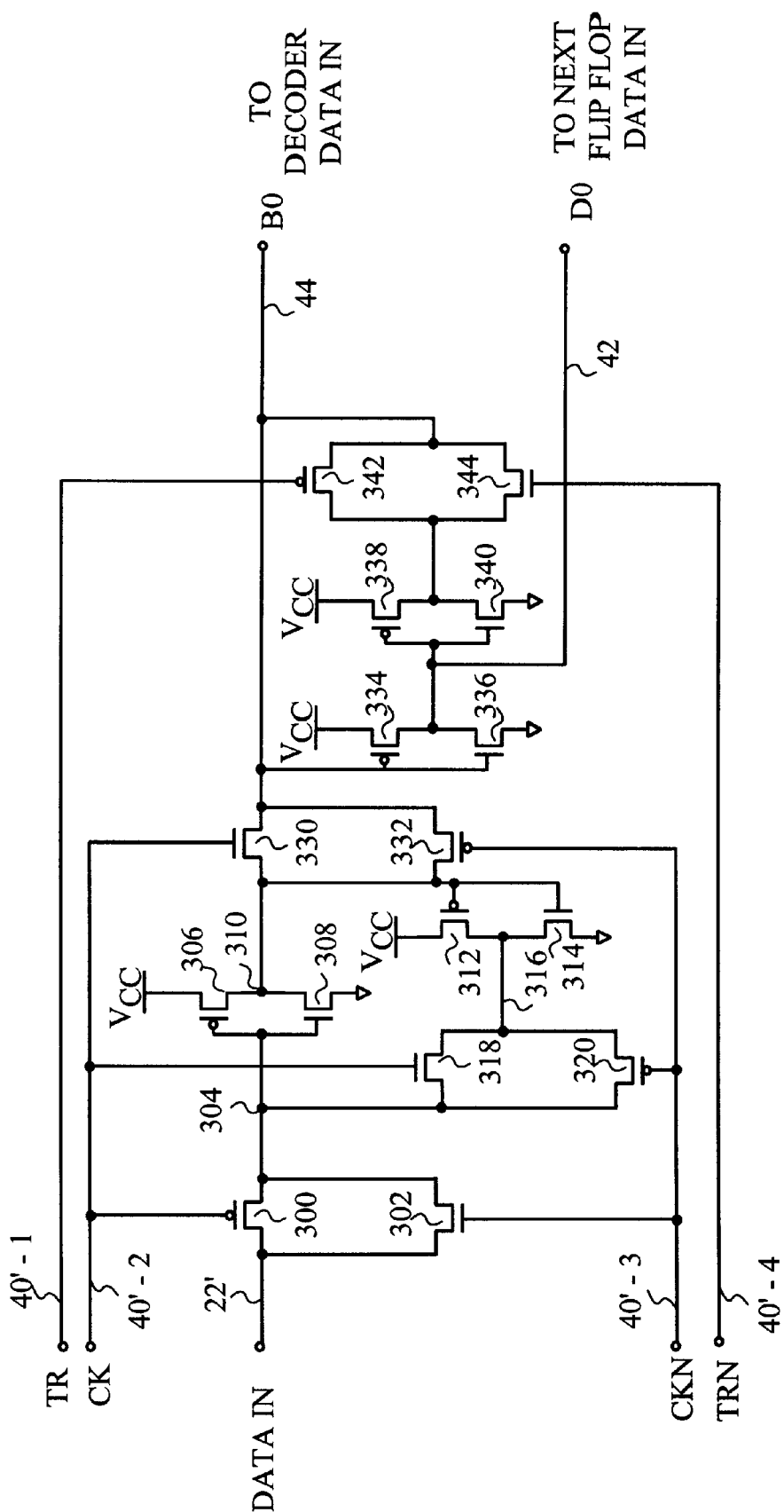
FIG. 8 is a detailed schematic of the preferred master-slave flip used for the serpentine shift register.

Referring to FIG. 8, there is shown a schematic diagram of the preferred form of flip flop for the serpentine shift register. The flip flop is a master-slave type. To load a configuration bit into it, the bit is placed on the Data In line 22' and the TR and CK clocks on lines 40'-1 and 40'-2 are driven low (these two clocks are identical for the load operation), and their complements TRN and CKN are drive lines 40'-4 and 40'-3 of local clock bus 40' high. This state of affairs turns on the pass transistors 300 and 302 so that the bit on line 22' reaches node 304 and is inverted and driven onto node 310 by the inverters comprised of transistors 306 and 308. The inverted bit on node 310 gets inverted again by the inverter comprised of transistors 312 and 314 and gets stored on node 316. The two inverters comprised of transistors 306/308 and 312/314 are cross coupled through the pass structure comprised of transistors 318 and 320 and comprise the master latch. This pass structure turns on when CK goes high and its complement CKN goes low thereby completing the cross coupling path and latching the data bit into the master latch. The pass structure comprised of transistors 300 and 302 turns off when CK goes high and its complement CKN goes low. When CK goes high and its complement CKN go low, TR and its complement TRN do the same thing. The combination of CK high and CKN low causes the pass structure comprised of transistors 330 and 332 to turn on thereby coupling the bit on node 310 to the input of the first inverter in the slave latch, the first inverter being comprised of transistors 334 and 336. The slave latch is comprised of the pass structure comprised of transistors 330 and 332 and the inverters comprised of transistors 338, 340, 334 and 336 and the pass structure comprised of transistors 342 and 344. When the pass structure comprised of transistors 330 and 332 is on, data is copied from the master latch into the slave latch because the pass structure 342/344 is off because when CK is high, TR is also high. When CK goes low, TR goes low and pass structure 342/344 turns on thereby completing the feedback path and latching the bit into the slave latch. The Q output of the flip flop is the D0 output line 42 which is coupled to the Data In port of the next flip flop in the serpentine shift register. The Q* output is line 44 marked as signal BO which is coupled to the data input of the decoder.

DYNAMIC PROGRAMMING

The memory byte architecture of the genus of the invention has another significant advantage in being able to dynamically change the functionality of an FPGA by programming new logic blocks without affecting the programming of other logic blocks and without shutting down the FPGA. This reprogramming or programming of new logic blocks can be done without turning the FPGA off simply by asserting a reset signal at an external pin and supplying a bitstream which addresses the appropriate logic block to be reprogrammed and supplies the new configuration data to be stored in that logic block's configuration memory cells.

This allows electronic circuitry to be built with a feature set that includes multiple features some of which can be turned off for low end, less expensive products and others of which can be turned on for mid range products and the whole set can be turned on for the high end product.

Although the invention has been disclosed in terms of the preferred and alternative embodiments disclosed herein, those skilled in the art will appreciate possible alternative embodiments and other modifications to the teachings disclosed herein which do not depart from the spirit and scope of the invention. All such alternative embodiments and other modifications are intended to be included within the scope of the claims appended hereto.

What is claimed is:

1. A static RAM memory structure to store programming bits in a field programmable gate array integrated circuit having a plurality of logic blocks the functionality of which is defined by the programming bits stored in said memory structure, comprising:

a bistable latch forming part of a shift register that is used to store programming bits that have been shifted into said shift register in serial format thereby eliminating the need for a regular rectangular array of bit lines and word lines and eliminating the need to put said logic blocks in the interstices of said array of bit lines and word lines for storing a single bit to be programmed into a static RAM cell, said bistable latch having at least one data output and having a data input for receiving a programming bit to be stored temporarily in said bistable latch;

a one-of-N decoder having a data input coupled to at least one said data output of said bistable latch and N data outputs and having an address input for receiving a plurality of address signals which control said decoder by their logic states to form a conductive path between said data input and one of said N data outputs so as to couple said programming bit stored in said bistable latch to one of said N data outputs; and a plurality of static RAM data latches, each having a data input coupled to one of said N data outouts of said one-of-N decoder so as to receive said programming bit stored in said bistable latch when said data output of said one-of-N decoder coupled to one of said static RAM data latches is selected for coupling to said data input of said one-of-N decoder, and having a data output for coupling to a node in a field programmable gate array to help establish the functionality thereof.

* * * * *